(12) United States Patent
Nishimura et al.

(10) Patent No.: US 6,437,484 B1
(45) Date of Patent: Aug. 20, 2002

(54) PIEZOELECTRIC RESONATOR

(75) Inventors: Michiaki Nishimura; Kousei Kamigaki; Ken-ichi Yoshimura; Hirotaka Tsuyoshi, all of Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/472,944

(22) Filed: Dec. 27, 1999

(30) Foreign Application Priority Data

Dec. 24, 1998 (JP) .......................................... 10-366970
Feb. 26, 1999 (JP) .......................................... 11-050263
Nov. 30, 1999 (JP) .......................................... 11-339974

(51) Int. Cl.[7] .............................................. H01L 41/08
(52) U.S. Cl. ...................................... 310/324; 310/334
(58) Field of Search ............................... 310/321, 322, 310/324, 334, 335, 336, 337; 333/133, 187–192

(56) References Cited

U.S. PATENT DOCUMENTS 4,240,003 A * 12/1980 Larson, III ................... 310/334
4,456,850 A * 6/1984 Inoue et al. .................. 310/324
4,502,932 A * 3/1985 Kline et al. ............. 310/324 X
5,825,117 A * 10/1998 Ossmann et al. ....... 310/334 X
5,873,153 A * 2/1999 Ruby et al. ............. 310/334 X
5,910,756 A * 6/1999 Ella ............................. 310/324

* cited by examiner

Primary Examiner—Mark O. Budd
(74) Attorney, Agent, or Firm—Hogan & Hartson, L.L.P.

(57) ABSTRACT

A piezoelectric resonator having a resonator element in or on a substrate, said resonator element comprising a laminate of a plurality of piezoelectric ceramic layers and a plurality of electrode layers which are alternately laminated one upon the other, the piezoelectric ceramic layers neighboring up and down being set to oscillate in opposite phases relative to each other. In the piezoelectric resonator, the piezoelectric ceramic layers neighboring up and down undergo the thickness longitudinal oscillation in opposite phases, suppressing the oscillation of the fundamental mode and strongly exciting the oscillation of a mode of a high degree of not lower than the second degree. The piezoelectric resonator utilizing the mode of a high degree of not lower than the second degree is little affected by spurious caused by the oscillation of the fundamental mode.

14 Claims, 15 Drawing Sheets

PIEZOELECTRIC RESONATOR

BACKGROUND OF THE INVENTION

1. Field of the Invention

The present invention relates to a piezoelectric resonator equipped with a resonator element which comprises a laminate of a plurality of piezoelectric ceramic layers and a plurality of electrode layers which are alternately laminated one upon the other.

2. Description of the Prior Art

The trend toward higher frequencies of electric signals used in radio communications and electric circuits, has urged the development of filters adapted to electric signals of high frequencies.

In the radio communication, for example, microwaves of around 2 GHz are becoming a main stream and, besides, there is a move toward establishing the standards for obliging the use of high frequencies of not lower than several gigahertz. It has therefore been demanded to provide a filter which is cheap in cost and has high performance to meet high frequencies.

An SAW filter is drawing attention in recent years using an elastic surface wave resonator (SAW resonator) which transmits acoustic waves along the surfaces of a solid. This filter utilizes the resonance of an elastic surface wave and a high-frequency electric field applied across the comb-shaped electrodes formed on the surface of a solid, and features a high selectivity of frequencies, and is widely used as an excellent band-pass filter.

In recent years, there has been proposed a resonator utilizing a thickness longitudinal (extensional) oscillation mode of a thin film that exhibits piezoelectric property. In this resonator, the piezoelectric thin film produces thickness longitudinal oscillation which produces resonance in the direction of thickness of the thin film. This resonator therefore is called bulk elastic wave resonator (BAW resonator).

Referring, for example, to FIG. 18, U.S. Pat. No. 4,320,365 discloses a BAW resonator comprising a substrate 61, a support film 63 formed on the surface of the substrate 61, a buffer layer 65 formed on the support film 63, a first electrode 66 formed on the buffer layer 65, a piezoelectric thin film 67 formed on the first electrode 66, and a pair of second electrodes 68 formed on the piezoelectric thin film 67. In this BAW resonator, an oscillation body (resonator element) is formed by the buffer layer 65, first electrode 66, piezoelectric thin film 67 and second electrode 68. The support film 63 is formed on the upper surface of the substrate 61 so as to cover an oscillation space A formed in the substrate 61, and a portion contacting to the oscillation space A in the support film 63 oscillates due to oscillation of the oscillation body (resonator element).

There has further been proposed an acoustic impedance converter as shown in FIG. 19. This acoustic impedance converter includes a support film 72 formed on the surface of a substrate 71 and, further, includes, formed on the support film 72, an oscillation body (resonator element) comprising a first electrode 74, a piezoelectric thin film 73 formed on the first electrode 74, and a second electrode 75 formed on the piezoelectric thin film 73. The support film 72 is a multi-layer film in which thin layers a and b of two kinds of materials having dissimilar acoustic impedances are laminated in many number one upon the other. The thin layers a and b each have a thickness of one-fourth the wavelength of a standing wave produced by the oscillation (resonator element). In such an acoustic impedance converter, ultrasonic waves are effectively reflected by the layers in the support film toward the oscillation body (resonator element), to suppress the leakage of energy into the substrate 71 and to acoustically insulate the oscillation body (resonator element) from the substrate 71 (W. E. Newell, "Face-Mounted Piezoelectric Resonators", Proceeding of the IEEE, pp. 575–581, June, 1965 and U.S. Pat. No. 5,373,268).

The resonance frequency of the BAW resonator varies in inverse proportion to the thickness of the film. By using a thin film as a piezoelectric member, therefore, it is allowed to form a resonator of the GHz band. Besides, since the thin film can be directly formed on a semiconductor substrate such as of Si, GaAs or the like, the BAW resonator is drawing attention as an element that can be integrated.

In either the SAW resonator or the BAW resonator, the resonance frequency varies in reverse proportion to the gap between the electrodes. Therefore, a high frequency is obtained by decreasing the gap between the electrodes. In the SAW resonator, however, resonance of the first degree takes place when the gap between the comb-shaped electrodes is one-fourth the wavelength and, hence, the gap between the electrodes inversely varies into four times of the resonance frequency. In a frequency region in excess of 1 GHz, therefore, the gap between the comb-shaped electrodes becomes of the order of submicrons, and it becomes very difficult to form the electrodes (for example, when the comb-type electrodes are to be formed on the board of an LiTaO$_3$ single crystal, the gap between the comb-shaped electrodes becomes about 0.5 microns to obtain a piezoelectric resonance of 2 GHz). Besides, since the gap between the electrodes is of the order of submicrons, lack of resistance against the high-frequency electric power becomes a serious problem in the SAW resonator. In the high-power applications such as the transmission filters, the high-frequency SAW filter of a 2 GHz band has not yet been realized due to the lack of breakdown voltage since the gap between the electrodes is as very small as in the order of submicrons.

In the BAW resonator, on the other hand, resonance of the first degree takes place when the gap between the electrodes is one-half the wavelength, and the gap between the electrodes varies in inverse proportion to the two folds of the resonance frequency. Therefore, when the BAW resonator and the SAW resonator using the piezoelectric member exhibiting the same elastic property and having the same gap between the electrodes, are compared with each other, the BAW resonator makes it possible to obtain a resonance frequency two times as high as that of the SAW resonator. Further, the BAW resonator makes it possible to obtain the same resonance frequency with the gap between the electrodes which is twice as large as that of the SAW resonator and, hence, exhibits excellent resistance against the electric power compared with the SAW resonator.

At present, however, the frequency of the electric signals is sharply increasing, and it has been desired to obtain frequencies higher than high frequencies accomplished by the existing BAW resonators. It has further been desired to provide a filter that exhibits excellent resistance against the electric power in high-frequency regions.

High frequencies are obtained by two methods of either decreasing the thickness of the film or utilizing the resonance of a high degree. When it is attempted to increase the frequency by decreasing the thickness of the film, the gap between the electrodes becomes of the order of submicrons at frequencies of the level of several gigahertz even when the BAW resonator is used as described above, leaving a problem of precision in controlling the film thickness and resistance against the electric power. When the resonance of a high degree is utilized, frequencies which are two folds or three folds as high as the fundamental wave can be utilized while maintaining a given thickness of the film, enabling the resonance of a high frequency to be utilized maintaining a large film thickness. It is therefore possible to provide a resonator which can be used at frequencies of two folds, three folds or four folds as high as that of the conventional resonator that uses the primary standing waves (fundamental waves). In the resonance of a high degree, however, oscillation attenuates with the degree of resonance, resulting in a great reduction in the electro-mechanical coupling coefficient Kt that determines the bandwidth of the filter. Though the frequency could be increased, therefore, a wide-band filter required in the GHz band could not be realized.

Though the piezoelectric resonator such as BAW resonator has been used being incorporated in a piezoelectric oscillation circuit integral with, for example, a capacitor, it becomes necessary to provide space (oscillation permission space) for permitting oscillation between the substrate of the capacitor or the like and the piezoelectric resonator. This prevents the circuit board from being realized in a small size or in a decreased thickness.

SUMMARY OF THE INVENTION

The object of the present invention is to provide a piezoelectric resonator having a large electro-mechanical coupling coefficient Kt necessary for realizing a wide-band filter that can be used in a high-frequency band, as well as to provide a filter using the resonator.

Another object of the present invention is to provide a piezoelectric resonator that can be directly joined to the substrate of the capacitor or the circuit board without forming oscillation permission space, that copes with high frequencies, and that is adapted to fabricating the circuit board or the like in a small size and in a decreased thickness.

According to the present invention, there is provided a piezoelectric resonator having a resonator element in or on a substrate, said resonator element comprising a laminate of a plurality of piezoelectric ceramic layers and a plurality of electrode layers which are alternately laminated one upon the other, the piezoelectric ceramic layers neighboring up and down being set to oscillate in opposite phases relative to each other.

According to the present invention, there is further provided a filter having a substrate, a support film formed on the surface of the substrate and a plurality of resonator elements arranged in parallel on the surface of said support film, said resonator elements comprising a laminate of a plurality of piezoelectric ceramic layers and a plurality of electrode layers which are alternately laminated one upon the other, the piezoelectric ceramic layers neighboring up and down being set to oscillate in opposite phases relative to each other.

According to the present invention, further, there is provided a filter having a plurality of resonance elements arranged in parallel in or on the surface of a substrate; wherein said resonator elements comprise a laminate of a plurality of piezoelectric ceramic layers and a plurality of electrode layers alternately laminated one upon the other in a manner that the piezoelectric ceramic layers neighboring up and down are set to oscillate in opposite phases relative to each other, and a pair of first terminal electrodes and a pair of second terminal electrodes connected to some of the plurality of electrode layers;

the laminate constituting said resonator elements includes the piezoelectric ceramic layers of the same thickness in an odd number which is not smaller than three, and has electrode layers disposed on the outer surface of the uppermost piezoelectric ceramic layer and on the outer surface of the lowermost piezoelectric ceramic layer;

between the pair of first terminal electrodes, one first terminal electrode is connected to the uppermost electrode layer, and the other first terminal electrode is connected to the lowermost electrode layer;

the pair of second terminal electrodes are alternately connected to a plurality of intermediate electrode layers positioned between the uppermost electrode layer and the lowermost electrode layer; and the amplitude of oscillation occurring in the intermediate piezoelectric ceramic layers between the uppermost piezoelectric ceramic layer and the lowermost piezoelectric ceramic layer is two times as great as the amplitude of oscillation occurring in the uppermost piezoelectric ceramic layer and in the lowermost piezoelectric ceramic layer.

In the piezoelectric resonator element of the present invention, the neighboring piezoelectric ceramic layers oscillate in opposite phases. Therefore, when the resonator element is constituted by a laminate of two piezoelectric ceramic layers each having a thickness t, acoustic standing waves are most efficiently excited having such a degree (second or higher degree) that the half wavelength is just equal to the thickness t. In the conventional BAW resonator comprising a single piezoelectric layer having a thickness 2t, fundamental waves are strongly excited having a half wavelength that is equal to the thickness 2t. Therefore, the piezoelectric resonator of the present invention exhibits a large electro-mechanical coupling coefficient Kt at a resonance frequency two times as high as that of the conventional BAW resonator despite it has piezoelectric ceramic layers (two layers) of a thickness equal to that of the conventional BAW resonator. That is, in the piezoelectric resonator of the present invention, the piezoelectric ceramic layers neighboring up and down undergo the thickness longitudinal (extensional) oscillation in opposite phases, whereby the oscillation of the fundamental mode is suppressed, and the oscillation of a mode of a high degree of not lower than the second degree is strongly excited. Accordingly, the piezoelectric resonator of the present invention utilizing the mode of a high degree of not lower than the second degree, is little affected by spurious caused by the oscillation of the fundamental mode.

When it is attempted to obtain the same resonance frequency as that of the conventional thin-film BAW resonator, the piezoelectric resonator of the present invention makes it possible to increase the film thickness by an amount of utilizing a high-degree mode as compared with the conventional thin-film BAW resonator that utilizes the fundamental mode, contributing to enhancing the degree of freedom for fabrication and, hence, to improving resistance against the electric power (breakdown voltage).

The resonator of the present invention can be driven by setting the direction of polarization to be the same and by applying an electric field in the same direction, or can be driven by setting the direction of polarization to be opposite and by applying an electric field in the same direction. When the resonator is driven by setting the direction of polarization to be opposite and by applying an electric field in the same direction, the film thickness for obtaining the same frequency may be increased to two times as large as that of the conventional thin-film BAW resonator. Besides, the gap between the input electrode and the output electrode at the time of driving can be increased into two folds. Therefore, the intensity of the electric field that is applied can be halved, and the breakdown voltage can be further increased.

Thus, the piezoelectric resonator of the present invention makes it possible to realize a wide GHz-band filter that can be used at frequencies two folds as high as when the SAW resonator or the conventional BAW resonator is used.

In particular, upon setting the thickness of the piezoelectric ceramic layer to be not larger than 2 μm, it is allowed to obtain a strongly excited piezoelectric resonance at a frequency of not lower than 1 GHz and, hence, to realize a favorable thin-film piezoelectric resonator.

Further, when the resonator element is provided on the support film formed on the surface of the substrate, oscillation space is formed in the support film on the side opposite to the surface on where the resonator element is formed, so that the oscillation of the resonator element is little transmitted to the substrate. Thus, there is obtained a piezoelectric resonator having favorable characteristics being little affected by spurious.

Further, the piezoelectric ceramic layer on the outer periphery of the uppermost electrode layer is not polarized, so that the outer peripheral portion acquires a hardness larger than that of the central portion where the energy is confined. Therefore, more energy is confined in the central portion than that of when the outer peripheral portion is polarized in a predetermined direction, and a piezoelectric resonator having favorable characteristics is obtained.

When the piezoelectric ceramic layer is made of a piezoelectric material containing Pb and Ti, the support film is made of silicon nitride, the total thickness of the piezoelectric ceramic layers is denoted tp, the thickness of the support film by ts, and the degree of oscillation of the thickness longitudinal oscillation mode by n, then, it is desired that the ratio ts/tp satisfies:

$$2.4n-5.6 \leq ts/tp \leq 2.7n-4.0$$

(0<ts/tp when the degree n of oscillation is 2).

In this case, the ratio ts/tp of the thickness of the support film to the sum of thicknesses of the piezoelectric ceramic layers is optimized, the electro-mechanical coupling coefficient is maximized in the oscillation mode of any degree, and the electro-mechanical coupling coefficients of oscillation modes of undesired degrees are suppressed. By using such a piezoelectric resonator, it is allowed to obtain a wide-band filter that can be used in a high-frequency band.

Further, when the piezoelectric ceramic layer is made of a piezoelectric material containing Pb and Ti, the support film is made of a diamond film, the total thickness of the piezoelectric ceramic layers is denoted by tp, the thickness of the support film by ts, and the degree of oscillation of the thickness longitudinal oscillation mode by n, then, it is desired that the ratio ts/tp satisfies:

$$5.4n-12.1 \leq ts/tp \leq 5.8n-8.5$$

(0<ts/tp when the degree n of oscillation is 2).

In this case, too, the ratio ts/tp of the thickness of the support film to the sum of thicknesses of the piezoelectric ceramic layers is optimized, the electro-mechanical coupling coefficient is maximized in the oscillation mode of any degree, and the electro-mechanical coupling coefficients of oscillation modes of undesired degrees are suppressed.

Further, when the piezoelectric resonator of the invention has two piezoelectric ceramic made of a piezoelectric material containing Pb and Ti, operates in the thickness longitudinal oscillation mode, and when the sound velocity (km/s) of the support film is denoted by V, the total thickness of the piezoelectric ceramic layers by tp, and the thickness of the support film by ts, then, it is desired that the ratio ts/tp of satisfies:

$$0 < ts/tp \leq 0.2v-0.76$$

in the oscillation mode of the second degree;

$$0.25v-1.08 \leq ts/tp \leq 0.54v-1.84$$

in the oscillation mode of the third degree; and $$0.54v-1.75 \leq ts/tp \leq 0.87v-2.86$$

in the oscillation mode of the fourth degree.

Upon satisfying the above-mentioned conditions, the piezoelectric resonator having two piezoelectric ceramic layers exhibits an optimum ratio ts/tp of the thickness of support film to the sum of thicknesses of the piezoelectric ceramic layers in the oscillation mode of any degree owing to the speed of sound of the support film, maximizing the electro-mechanical coupling coefficient in the oscillation mode of any degree and suppressing the electro-mechanical coupling coefficients of oscillation modes of undesired degrees.

In the piezoelectric resonator of the present invention having a resonator element provided on a support film formed on a substrate, on the surface of the substrate or in the substrate, it is desired that;

the laminate constituting the resonator element includes the piezoelectric ceramic layers of the same thickness in an odd number which is not smaller than three, and has electrode layers disposed on the uppermost layer and on the lowermost layer; and that the amplitude of oscillation occurring in the intermediate piezoelectric ceramic layers between the uppermost piezoelectric ceramic layer and the lowermost piezoelectric ceramic layer is two times as great as that of oscillation occurring in the uppermost piezoelectric ceramic layer and in the lowermost piezoelectric ceramic layer.

In this piezoelectric resonator, further, it is desired that a pair of first terminal electrodes are connected to the uppermost electrode layer and the lowermost electrode layer (between the pair of first terminal electrodes, one first terminal electrode is connected to the uppermost electrode layer, and the other first terminal electrode is connected to the lowermost electrode layer). Further, the pair of second terminal electrodes are alternately connected to a plurality of intermediate electrode layers positioned between the uppermost electrode layer and the lowermost electrode layer.

In the piezoelectric resonator having such a structure, the piezoelectric ceramic layers neighboring up and down undergo the thickness longitudinal oscillation in opposite phases relative to each other, and the oscillation in the portion except the uppermost piezoelectric ceramic layer and the lowermost piezoelectric ceramic layer, has a phase opposite to, and has an amplitude twice as great as, the oscillation occurring in the uppermost piezoelectric ceramic layer and in the lowermost piezoelectric layer. Therefore, no oscillation occurs on the surface of the resonator element, and the oscillation is confined in the whole resonator element. Accordingly, there is no need to provide oscillation space in the support film on the side opposite to the surface on where the resonator element is formed. There is no need of forming a mirror layer, either, for attenuating the oscillation of the resonator element. In the piezoelectric resonator having a resonator element provided on the surface of the substrate or in the substrate, no oscillation space needs be provided between the substrate and the resonator element. Accordingly, the piezoelectric resonator of the present invention is very advantageous for producing the circuit board and the like in decreased thicknesses and in small sizes.

According to the filter of the present invention in which a plurality of the resonator elements of the above-mentioned structure are arranged in parallel on the support film formed on the surface of the substrate, or directly on the surface of the substrate, or in the substrate, the resonator elements suppress the oscillation of the fundamental mode, and strongly excite oscillation of a mode of a high degree of not lower than the second degree. That is, the present invention makes it possible to obtain a wide-band filter that can be used at high frequencies since the resonator elements are arranged in a plural number in parallel, as compared with the filters using the known piezoelectric resonators. By controlling the ratio ts/tp of the thickness of the support film to the sum of thicknesses of the piezoelectric ceramic layers, further, it is allowed to suppress the electro-mechanical coupling coefficients of undesired oscillation of modes lower than, or higher than, the degree of oscillation that is used and, hence, to obtain a favorable filter that is little affected by spurious.

BRIEF DESCRIPTION OF THE DRAWINGS

With respect to the piezoelectric resonator having piezoelectric ceramic films of PZT and a support film of silicon nitride.

With respect to the piezoelectric resonator having piezoelectric ceramic films of PZT and a support film of a diamond film.

FIG. 20 is a view illustrating a structure of a resonator element directly provided on a substrate, wherein

DETAILED DESCRIPTION OF THE INVENTION

The invention will now be described in detail based on embodiments shown in the accompanying drawings.

The following embodiments 1 to 5 deal with piezoelectric resonators of the type in which a resonator element is provided on a support film formed on the surface of the substrate, and the embodiment 6 deals with a piezoelectric resonator of the type in which the resonator element is provided directly on the surface of the substrate or in the substrate.

(Embodiment 1)

Figure 1:
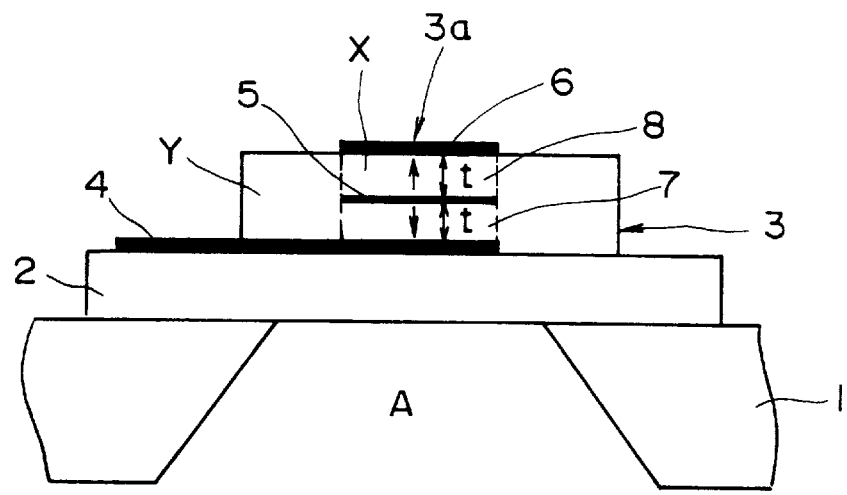
FIG. 1 is a sectional view illustrating a piezoelectric resonator of the present invention.
Figure 2:
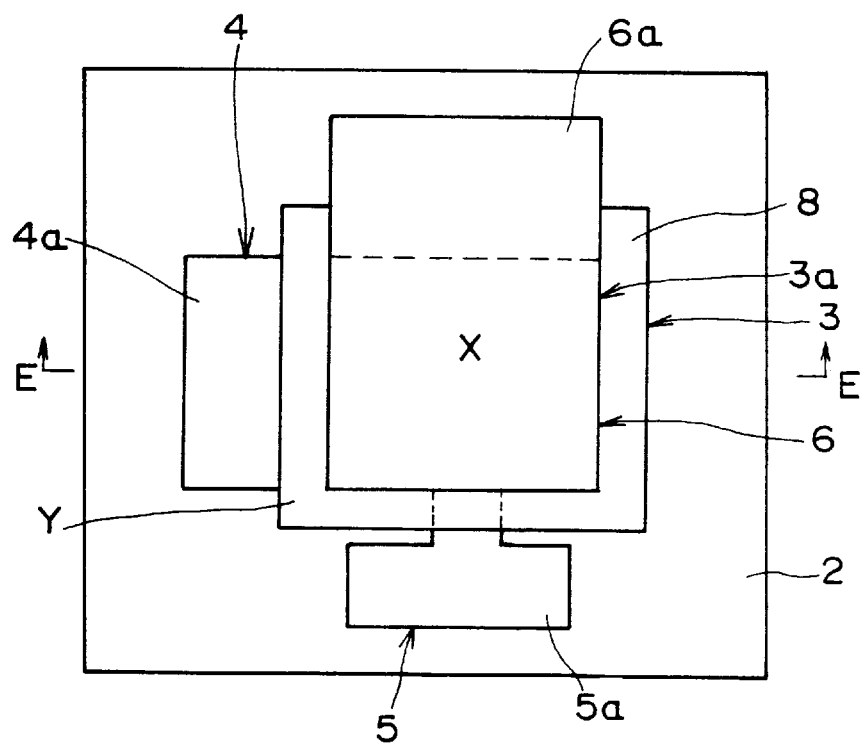
FIG. 2 is a plan view of FIG. 1.

FIG. 1 is a sectional view of a piezoelectric resonator (BAWR) of the present invention, FIG. 2 is a plan view of the piezoelectric resonator of the present invention, and FIG. 1 is a sectional view along the line E—E of FIG. 2.

As shown in FIG. 1, the piezoelectric resonator of this type has a support film 2 formed on a substrate 1. A laminate 3 is provided on the upper surface of the support film 2. The laminate 3 has electrode films 4, 5 and 6, and piezoelectric ceramic films 7 and 8. On the central portion is formed a resonator element 3a of a structure in which the electrode films 4, 5 and 6 and the piezoelectric ceramic films 7 and 8 are alternately laminated on upon the other. In the resonator element 3a, an uppermost electrode film 6 is formed on the central portion on the upper surface of the uppermost piezoelectric ceramic film 8, and a lowermost electrode film 4 is formed on the central portion on the lower surface of the lowermost piezoelectric ceramic film 7.

The piezoelectric ceramic films 7 and 8 are polarized in the opposite directions in the direction of thickness. An oscillation space A is formed on the side opposite to the surface of the support film 2 on where the resonator element 3a is formed. Further, the piezoelectric ceramic films 7 and 8 have the same thickness t of not larger than 2 $\mu$m, respectively. As will be described later, however, the thicknesses t of the piezoelectric ceramic films 7 and 8 may not be the same. From the standpoint of increasing the frequency, it is desired that the piezoelectric ceramic films 7 and 8 have small thicknesses t, which, however, may be selected depending upon the frequency at which it is used.

Referring to FIG. 2, the electrode films 4, 5 and 6 are drawn at their ends toward the outside of the resonator element 3a. The drawn electrodes 4a, 5a and 6a formed at the ends of the electrode films are so arranged as will not be overlapped one upon the other. The electrode film 5 is used for effecting the polarization but turns into a floating electrode that is not used when the device is in operation.

The electrode films 4, 5 and 6 are superposed at a central portion (resonator element 3a) of the laminate 3 to confine energy in the central portion X. The outer peripheries Y of the uppermost electrode film 6 have not been polarized, i.e., the piezoelectric ceramic films 7 and 8 of the laminate 3, except the resonator element 3a, have not been polarized. In other words, the outer peripheries Y are so formed as to surround the central portion X, and are polarized in a random fashion.

It is desired that the piezoelectric ceramic films 7 and 8 are formed of a ferroelectric material. This is because the ferroelectric materials can be polarized in the same direction by applying a DC electric field of the same direction across the electrode films 4 and 5, and across the electrode films 5 and 6. When the directions of polarization are to be reversed relative to each other, a DC electric field may be applied across the electrode film 5 and the electrode films 4, 6. Here, the DC electric field used for the polarization treatment must be set to a value larger than the coercive electric field of the ferroelectric material.

A ferroelectric material is used as the piezoelectric ceramic films 7 and 8. This is because when there is used a piezoelectric material such as ZnO or AlN which is not a ferroelectric material and of which the polarity cannot be inverted, the directions of polarization of the layers cannot be controlled during the production, and it becomes difficult to inverse the directions of polarization between the neighboring layers. Besides, the ferroelectric material has a large electro-mechanical coupling coefficient Kt and is useful for realizing a wide-band filter.

The piezoelectric ceramic films 7 and 8 must have a particularly large electro-mechanical coupling coefficient in the thickness longitudinal mode. It is therefore desired that the piezoelectric ceramic films 7 and 8 are composed of piezoelectric ceramics of the type of $Pb(Zr_{1-x}Ti_x)O_3$ (hereinafter abbreviated as PZT) or of the type of $PbTiO_3$ (hereinafter abbreviated as PT) containing Pb and Ti as chief components. The piezoelectric ceramic films 7 and 8 can be formed by the thin-film forming method such as sol-gel method, sputtering method, etc. or by the layer lamination technology.

The electrode films 4, 5 and 6 are formed of Pt, Au, Al, etc., and are prepared by the sputtering method, vacuum vaporization method or the like method.

The support film 2, too, undergoes the thickness longitudinal oscillation together with the piezoelectric ceramic films 7 and 8. To obtain high frequencies, therefore, it is desired that the support film 2 is formed of a material that exhibits a high speed of sound, such as silicon nitride, SiC or diamond. The support film 2 is formed by the CVD method or the like method.

The substrate 1 is formed of silicon, etc. An oscillation space A for acoustically insulating the substrate 1 and the resonator element 3a from each other, is formed by the chemical etching method using KOH, etc. or by the reactive ionic etching method. Upon forming the oscillation space A on the side opposite to the surface of the support film 2 on where the resonator element 3a is formed, oscillation of the resonator element 3a is little transmitted to the substrate 1, and there is obtained a piezoelectric resonator exhibiting favorable characteristics little affected by spurious.

In the thus constituted piezoelectric resonator, the directions of polarization are reversed between the neighboring piezoelectric ceramic films 7 and 8. Upon applying an AC electric field of a high frequency across the electrode film 4 and the electrode film 6, therefore, high degree acoustic standing waves which have a half-wave length equal to the thickness t of either the piezoelectric ceramic film 7 or 8, are most efficiently excited by the resonator element 3a. Thus, there is provided a piezoelectric resonator which exhibits a large electro-mechanical coupling coefficient Kt at a resonance frequency twice as high compared with the conventional BAW resonator having a single piezoelectric ceramic film which strongly excites the fundamental waves having a half-wave length equal to the film thickness 2t, though the resonator element 3a has the same film thickness. The same effect can also be obtained even when the piezoelectric ceramic films are polarized in the same direction and the electric field is applied in the opposite direction, since the upper and lower piezoelectric ceramic films oscillate in opposite phases.

When it is intended to obtain the same resonance frequency as that of the conventional thin-film BAW resonator, the piezoelectric resonator of the present invention is allowed to possess a film thickness twice as large as that of the prior art, making it possible to further improve the breakdown voltage compared to that of the conventional thin-film BAW resonator.

Besides, the piezoelectric ceramic films 7 and 8 are not polarized in the outer peripheral portions Y of the uppermost electrode film 6. Hence, the peripheral portions Y possess a hardness larger than that in the central portion X, making it possible to confine more energy in the central portion X than when the outer peripheral portions Y are polarized in a predetermined direction, and to suppress the occurrence of ripples and, hence, to obtain a piezoelectric resonator having favorable characteristics.

Since the piezoelectric ceramic films 7 and 8 have a thickness t of not larger than 2 μm, the piezoelectric resonance is obtained at a frequency of not lower than 1 GHz.

Though the above description has dealt with an example in which the resonator element 3a was constituted by using two piezoelectric ceramic films 7, 8 and electrode films 4, 5 and 6, the piezoelectric resonator of the invention is in no way limited to the above-mentioned example only but may be the one in which the resonator element 3a is constituted by not less than three piezoelectric ceramic films.

Figure 3:
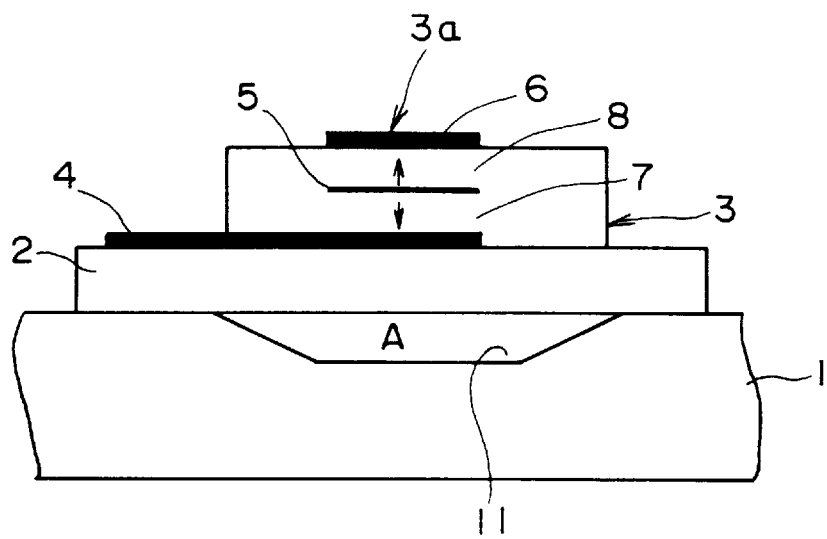
FIG. 3 is a sectional view illustrating another embodiment of the piezoelectric resonator of the invention.

FIG. 3 illustrates another example of the piezoelectric resonator of the present invention. In this piezoelectric resonator, a dent 11 is formed in the upper surface of the substrate 1 to form an oscillation space A on the side opposite to the surface of the support film 2 on where the resonator element 3a is formed. In other respects, the piezoelectric resonator is the same as that of FIG. 1.

This piezoelectric resonator exhibits the same effect as that of the piezoelectric resonator of FIG. 1.

Figure 4:
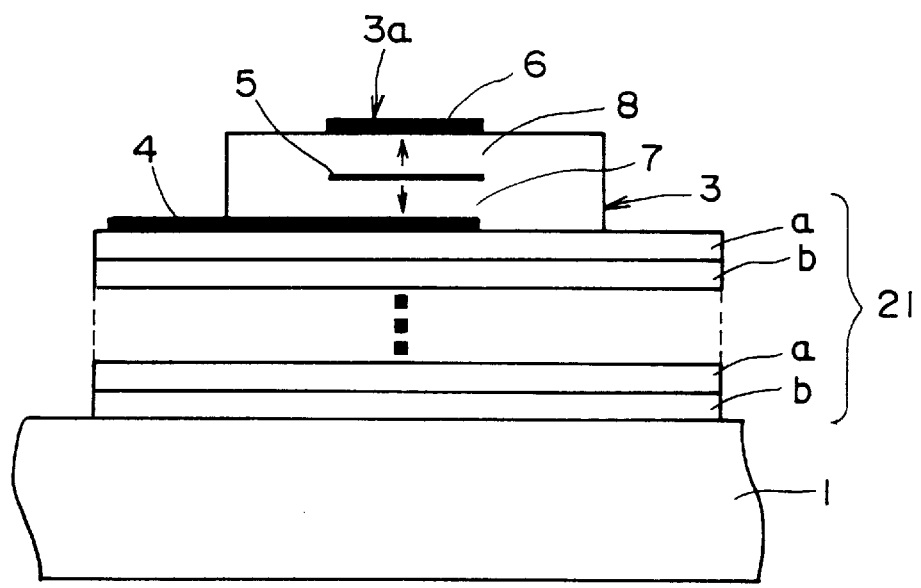
FIG. 4 is a sectional view illustrating a further embodiment of the piezoelectric resonator of the invention.

FIG. 4 illustrates a further example of the piezoelectric resonator of the present invention. This piezoelectric resonator has a support film 21 which comprises a laminate of a multiplicity of layers in which two kinds of thin layers a and b having different acoustic impedances are alternately laminated one upon the other. The two kinds of thin layers a and b have thicknesses which are, respectively, one-fourth the wavelength of acoustic waves excited by the resonator element 3a. In other respects, this piezoelectric resonator is the same as that of FIG. 1.

This piezoelectric resonator exhibits the same effect as that of the piezoelectric resonator of FIG. 1 without the need of forming oscillation space A.

The present inventors have analyzed the impedance characteristics for the resonance frequency using the piezoelectric resonator of the present invention and the conventional piezoelectric resonator. The piezoelectric resonator of the present invention possesses a support film (insulating film) comprising a diamond film of a thickness of 5 μm, and a resonator element comprising two piezoelectric films of PbTiO$_3$ (total thickness of 2 μm) (piezoelectric resonator of FIG. 1).

In the piezoelectric resonator of the present invention, a high-frequency electric field is applied to the two piezoelectric ceramic films that are polarized in the reverse directions in the direction of lamination (direction of thickness of the piezoelectric ceramic films) to analyze the impedance. The conventional piezoelectric resonator, on the other hand, possesses a single piezoelectric ceramic film (PbTiO$_3$) having a thickness of 2 μm and a diamond film having a thickness of 5 μm, and its impedance was analyzed by applying a high-frequency electric field thereto.

Figure 5:
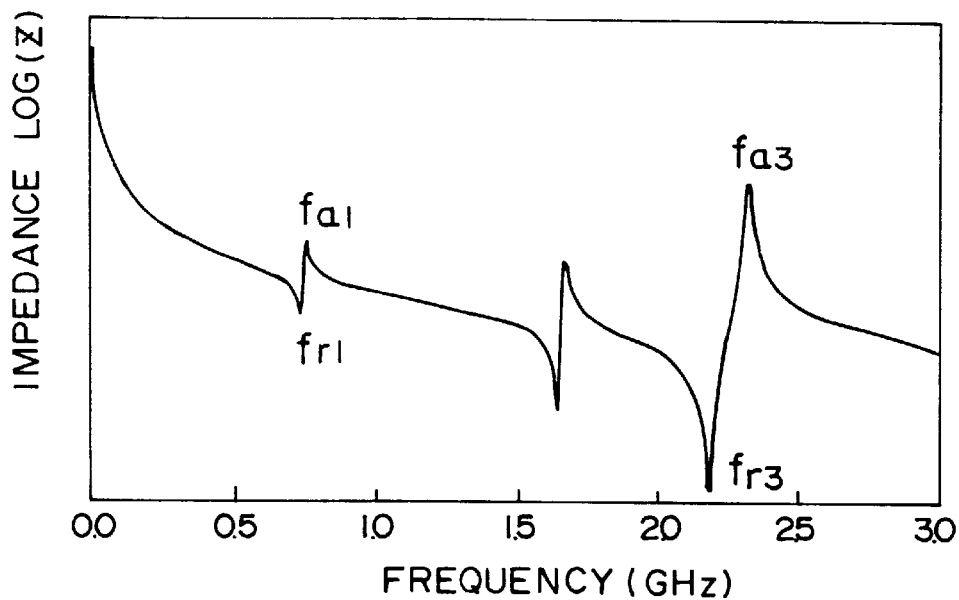
FIG. 5 is a diagram illustrating the impedance characteristics of the piezoelectric resonator of the invention.
Figure 6:
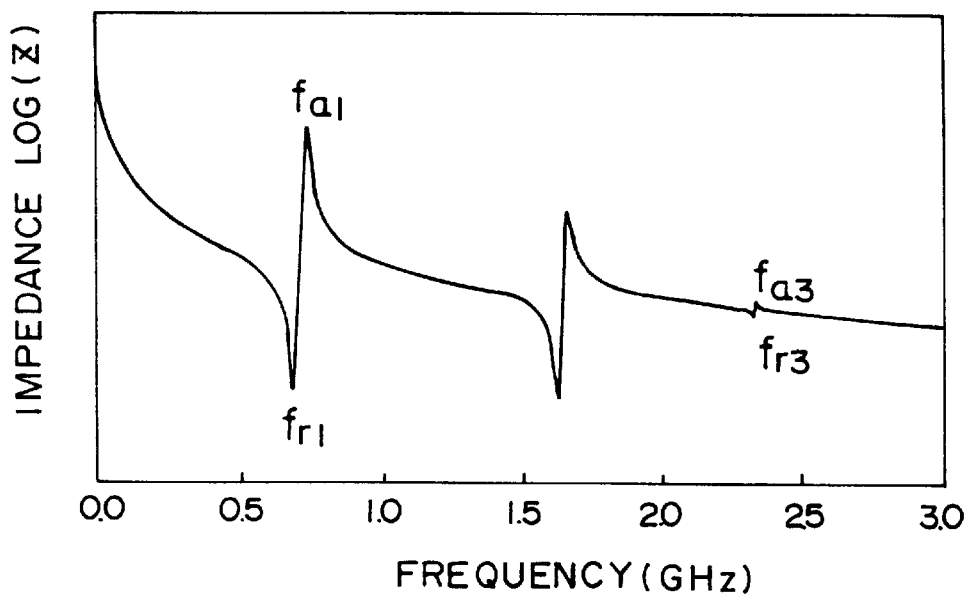
FIG. 6 is a diagram illustrating the impedance characteristics of a conventional piezoelectric resonator.

FIG. 5 illustrates the impedance characteristics of the piezoelectric resonator of the present invention, and FIG. 6 illustrates the impedance characteristics of the conventional piezoelectric resonator. It will be obvious from FIG. 6 that with the conventional piezoelectric resonator, the first-degree resonance of the composite oscillator of the support film and the piezoelectric ceramic film is most strongly excited at a frequency $fr_1$ ($fa_1$), and a difference between the resonance frequency (impedance is minimum) $fr_1$ and the anti-resonance frequency (impedance is maximum) $fa_1$ is the greatest compared to that of other high-degree resonances. As will be obvious from the amplitude of the third-degree resonance at $fr_3$ and $fa_3$, and the frequency difference between $fr_3$ and $fa_3$, the difference between the resonance frequency and the anti-resonance frequency greatly decreases with an increase in the degree of resonance. A decrease in the difference between the resonance frequency and the anti-resonance frequency causes Kt to greatly decrease with an increase in the degree.

With the piezoelectric resonator of the present invention as shown in FIG. 5, on the other hand, the greatest band width is obtained at the third-degree resonance $fr_3$ ($fa_3$) of the piezoelectric resonator. The third-degree resonance is a frequency at which one piezoelectric ceramic film excites standing waves of a half-wave length. It is allowed to obtain a large electro-mechanical coupling coefficient Kt at a resonance frequency which is strikingly high compared with that of the conventional resonator.

To obtain the resonance frequency and electromechanical coupling coefficient Kt comparable to those of the piezoelectric resonator of the present invention by using the conventional piezo-electric resonator, the thickness of the piezoelectric ceramic film of the conventional piezoelectric resonator must be decreased to one-half the thickness of the piezoelectric ceramic film of the piezoelectric resonator of the present invention. In this case, the piezoelectric ceramic film excites the standing waves of just a one-half wavelength, which is equal to the standing waves of one wavelength excited by the two piezoelectric ceramic films of the piezoelectric resonator of the present invention. Thus, when it is attempted to obtain the resonance frequency which is the same as that of the conventional piezoelectric resonator by using the piezoelectric resonator of the present invention, it is allowed to double the thickness of the piezoelectric ceramic films and, hence, to further increase the breakdown voltage against high-frequency electric power.

(Embodiment 2)

In the piezoelectric resonator having oscillation space shown in FIGS. 1 to 3, the piezoelectric ceramic films are used in two layers, the piezoelectric ceramic films are composed of a piezoelectric material containing Pb and Ti, the support film is composed of silicon nitride, the sum (t1+t2) of the thicknesses (μm) of the two piezo-electric ceramic films is denoted by tp, the thickness (μm) of the support film is denoted by ts, and the degree of oscillation of the thickness longitudinal oscillation mode is denoted by n. In this case, it is desired that the ratio ts/tp of the thickness ts of the support film to the sum tp of the thicknesses of the piezoelectric ceramic films satisfies;

$$2.4n-5.6 \leq ts/tp \leq 2.7n-4.0$$

(0<ts/tp when the degreen of oscillation is 2).

When the piezoelectric material containing Pb and Ti is used as the piezoelectric ceramic films and the silicon nitride is used as the support film, the thicknesses of the piezoelectric ceramic films and of the support film are optimized upon satisfying the above-mentioned relationship, the electro-mechanical coupling coefficient is maximized in the oscillation mode of any degree, and the electro-mechanical coupling coefficients of oscillation modes of undesired degrees are suppressed.

Figure 7:
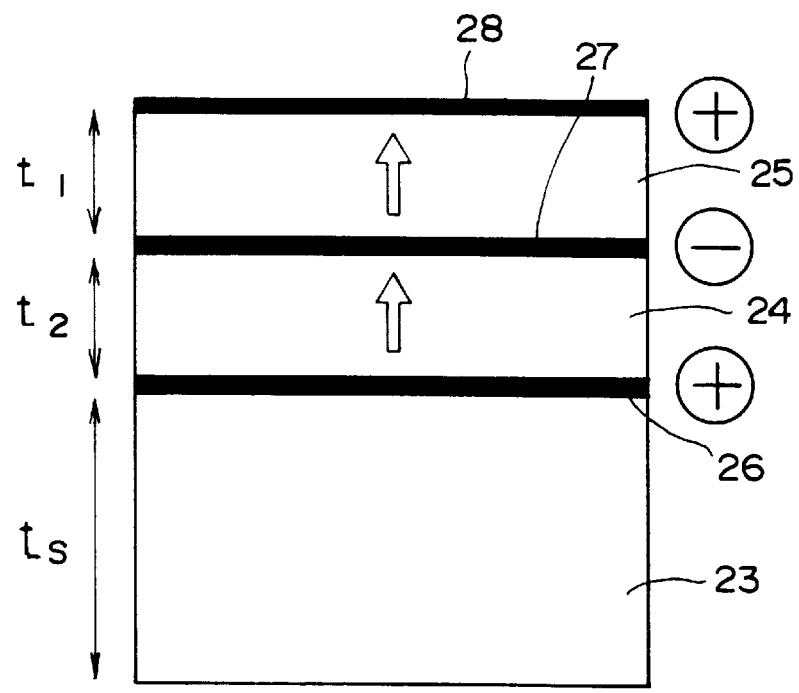
FIG. 7 is a diagram illustrating the direction of polarization of the piezoelectric resonator of the invention and a method of applying a voltage.

The present inventors have analyzed the impedance of the above-mentioned piezoelectric resonator of which the structure is schematically shown in FIG. 7 based on the finite element method using computer simulation. The analytical conditions consisted of using a support film 23 composed of silicon nitride (having a Young's modulus of 294 GPa and a density of 3200 Kg/m$^3$) and piezoelectric ceramic films 24 and 25 of PZT (having a Young's modulus of 80 GPa and a density of 7600 kg/m$^3$). Here, the thicknesses t1 and t2 of the piezoelectric ceramic films 24 and 25 were selected to be 0.6 μm, respectively, (sum of the thicknesses of the piezoelectric ceramic films 24 and 25 is 1.2 μm), the thicknesses of the electrode films 26, 27 and 28 were selected to be all 0.2 μm, and the thickness ts of the support film 23 was changed as a parameter. The two piezoelectric ceramic films 24 and 25 were polarized in the same direction, and an electric field was applied to the piezoelectric ceramic films 24 and 25 in the opposite directions.

Figure 8:
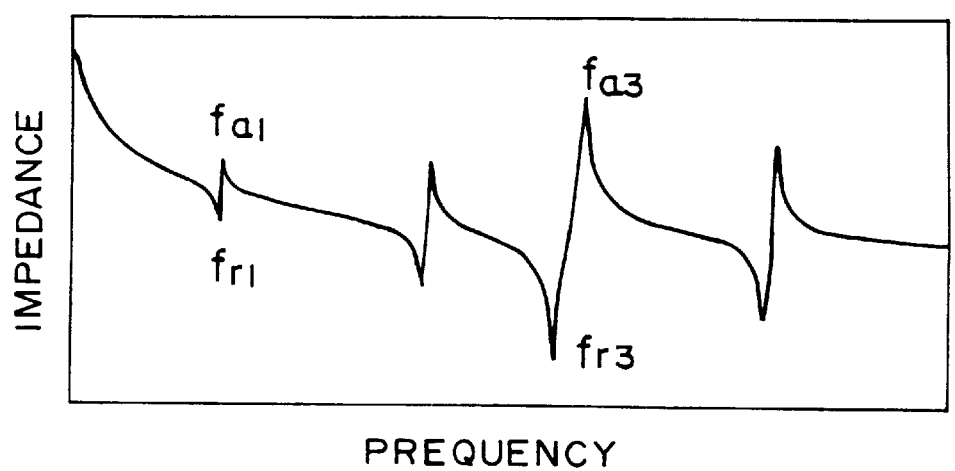
FIG. 8 is a diagram illustrating the impedance characteristics of the piezoelectric resonator of FIG. 7 of when the piezoelectric ceramic layer is made of PZT, and the support film is made of silicon nitride and has a thickness ts of 3.6 $\mu$m.

FIG. 8 shows the results of analysis, i.e., impedance characteristics (ts/tp=3) of when the support film 23 has a thickness ts of 3.6 μm. It will be understood that the oscillation of the thickness longitudinal oscillation mode of the third degree is strongly excited.

Figure 9A:
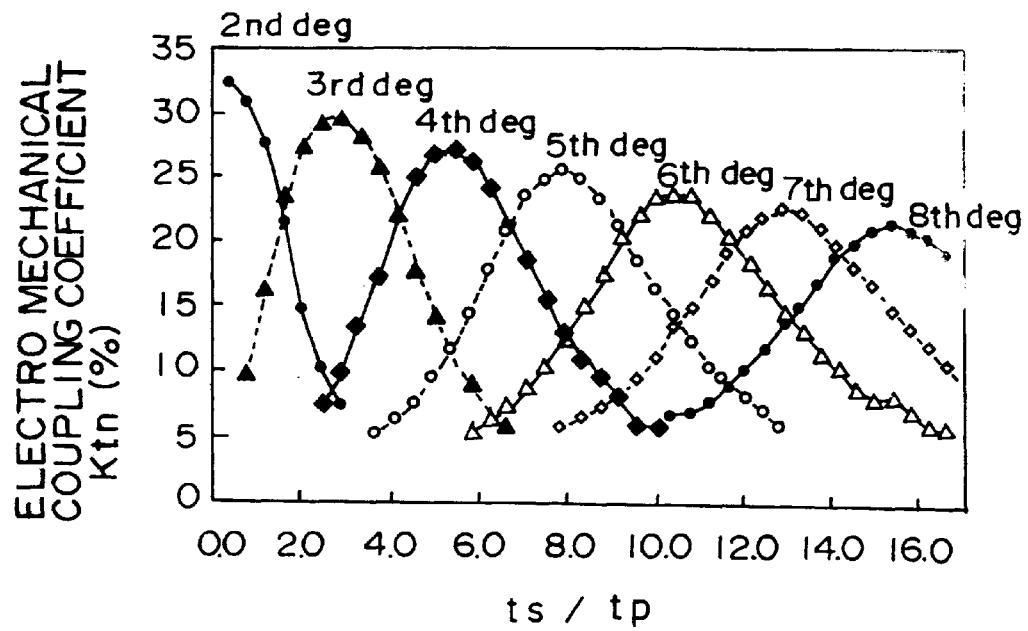
FIG. 9(a) is a diagram illustrating the dependency of the electro-mechanical coupling coefficient Ktn(%) upon the film thickness ratio ts/tp in the thickness longitudinal oscillation mode of an n-th degree.

FIG. 9(a) illustrates the dependency of the electro-mechanical coupling coefficient Ktn(%) of the thickness longitudinal oscillation mode of the n-th degree upon the film thickness ratio ts/tp. The electro-mechanical coupling coefficient Ktn(%) of the thickness longitudinal oscillation mode of the n-th degree is calculated from the following formula by finding the resonance frequency Frn and anti-resonance frequency Fan of the thickness longitudinal oscillation mode of the n-th degree from the impedance characteristics, $$Ktn(\%)=((Fan-Frn)/Frn)^{1/2} \times 100$$

It will be understood from FIG. 9(a) that the electro-mechanical coupling coefficient of the thickness longitudinal oscillation mode of the n-th degree can be increased upon properly controlling the film thickness ratio ts/tp, and the electro-mechanical coupling coefficients can be suppressed in the oscillation modes of not larger than the (n−1)-th degree and not smaller than the (n+1)-th degree. For example, when ts/tp is about 3, the oscillation mode of the third degree is strongly excited making it possible to suppress the electro-mechanical coupling coefficients of modes of the second degree or fourth and higher degrees. From the standpoint of increasing the electro-mechanical coupling coefficients, it is desired to use the oscillation modes of the second to fourth degrees.

Figure 9B:
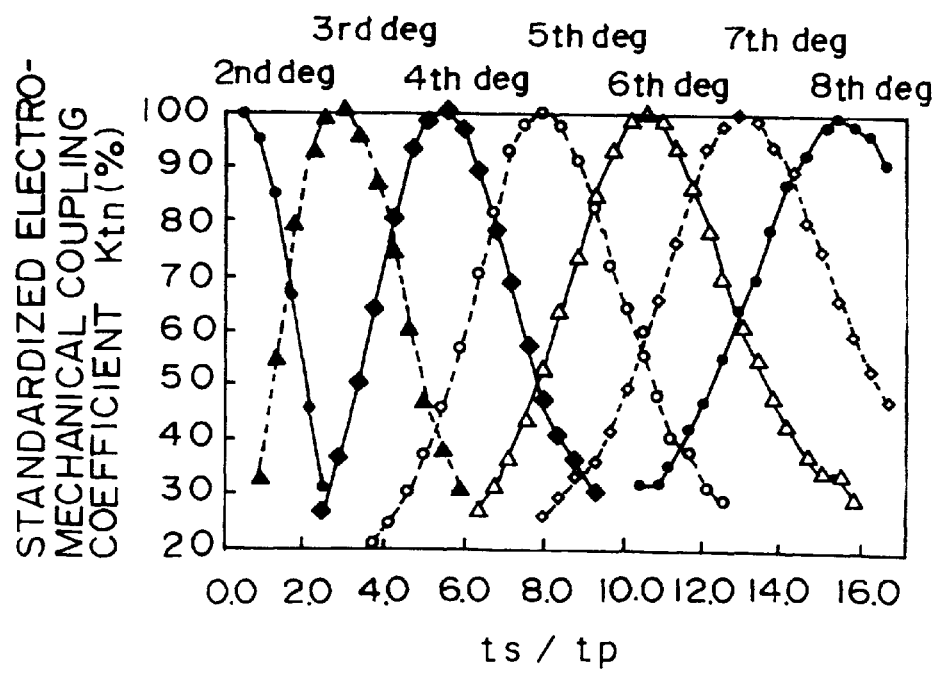
FIG. 9(b) is a diagram illustrating the dependency of the standardized electro-mechanical coupling coefficient Ktn(%) upon the thickness ratio ts/tp in the thickness longitudinal oscillation mode of the n-th degree.

From the graph of FIG. 9(a), maximum values Ktn(max) of the electro-mechanical coupling coefficients Ktn are found at respective oscillation degrees n, the electro-mechanical coupling coefficient Ktn is calculated when the maximum value Ktn(max) is set to be 100, the respective electro-mechanical coupling coefficients Ktn are standardized with Ktn(max) and are shown in FIG. 9(b). For example, Ktn(max) of the oscillation mode of the third degree is 30%. In a graph of FIG. 9(b), Ktn(max) is shown as 100.

Figure 10:
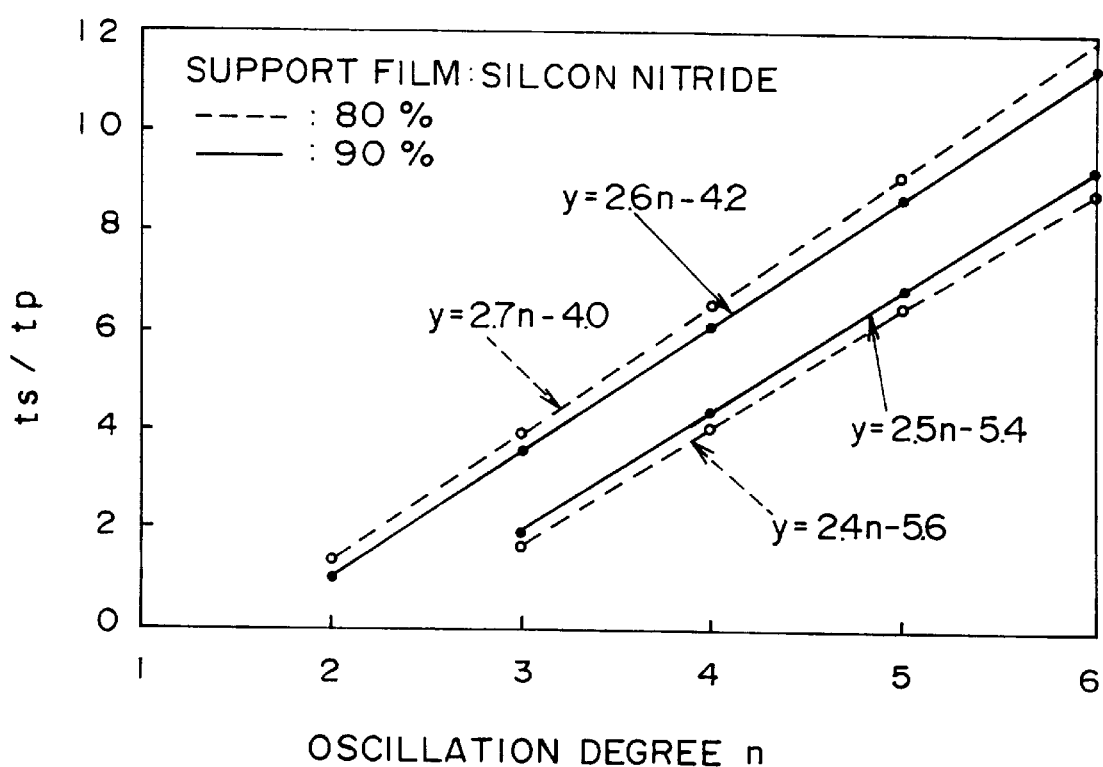
FIG. 10 is a graph of when a lower-limit value and an upper-limit value of a thickness ratio ts/tp are regarded as primary functions of the degree n of oscillation, the thickness ratio ts/tp being so selected that with which the lower-limit value and the upper-limit value thereof of the standardized electro-mechanical coupling coefficient of the piezoelectric resonator having piezoelectric ceramic films of PZT and a support film of silicon nitride becomes 80% and 90%.

In FIG. 9(b), the film thickness ratios ts/tp are so found that the standardized electro-mechanical coupling coefficients become not smaller than 80% and not smaller than 90% at respective oscillation degrees n. The film thickness ratios are then plotted as a function of the oscillation degree n to obtain a graph of FIG. 10. The lower-limit values and upper-limit values of the thickness ratios with which the standardized electro-mechanical coupling coefficients become not smaller than 80% and not smaller than 90%, can be regarded as primary functions of the degrees n of oscillation, and approximations thereof become as shown in the graph of FIG. 10. The graph of FIG. 10 shows the primary functions with the oscillation degree being denoted by n and the film thickness ratio ts/tp by y (broken lines represent 80% and solid lines represent 90%). In the oscillation mode of the third degree, for example, the lower-limit value of the film thickness ratio is about 2 with which the standardized electro-mechanical coupling coefficient becomes not smaller than 80%, and the upper-limit value is about 4.

From the graph of FIG. 10, when the thickness longitudinal oscillation mode of the n-th degree is utilized, to obtain not smaller than 80% of the standardized electro-mechanical coupling coefficient, the film thickness ratio ts/tp must satisfy;

$$2.4n-5.6 \leq ts/tp \leq 2.7n-4.0$$

(0<ts/tp when the oscillation degree n is 2).

When the ratio ts/tp satisfies the above-mentioned relationship, therefore, the electro-mechanical coupling coefficient can be maximized in the thickness longitudinal oscillation mode of the n-th degree. That is, there hold 0<ts/tp≦1.4 in the case of the oscillation mode of the second degree, 1.6 ≦ts/tp≦4.1 in the case of the oscillation mode of the third degree, and 4 ≦ts/tp≦6.8 in the case of the oscillation mode of the fourth degree.

FIG. 10 further shows the lower-limit value and the upper-limit value of the thickness ratio with which the standardized electro-mechanical coupling coefficient becomes not smaller than 90% as primary functions of the degree n of oscillation. In order for the standardized electro-mechanical coupling coefficient to become not smaller than 90%, a relationship;

$$2.5n-5.4 \leq ts/tp \leq 2.6n-4.2$$

(0≦ts/tp when the degree n of oscillation is 2) must be satisfied. In this case, it is allowed to further increase the electro-mechanical coupling coefficient at a desired degree n of oscillation.

The piezoelectric resonator was similarly analyzed by polarizing the two piezoelectric ceramic films 7 and 8 in the opposite directions and applying the electric field in the same direction. The results were the same as those shown in FIG. 10.

(Embodiment 3)

In the piezoelectric resonator having oscillation space shown in FIGS. 1 to 3, the piezoelectric ceramic films are used in two layers, the piezoelectric ceramic films are composed of a piezoelectric material containing Pb and Ti, the support film is composed of a diamond film, the sum of the thicknesses (μm) of the two piezo-electric ceramic films is denoted by tp, the thickness (μm) of the support film is denoted by ts, and the degree of oscillation of the thickness longitudinal oscillation mode is denoted by n. In this case, it is desired that the ratio ts/tp satisfies;

$$5.4n-12.1 \leq ts/tp \leq 5.8n-8.5$$

(0<ts/tp when the degree n of oscillation is 2).

When the piezoelectric material containing Pb and Ti is used as the piezoelectric ceramic films and diamond is used as the support film, the ratio ts/tp of the thickness of the support film to the sum of thicknesses of the piezoelectric ceramic films is optimized upon satisfying the above-mentioned relationship, the electro-mechanical coupling coefficient is maximized in the oscillation mode of any degree, and the electro-mechanical coupling coefficients of oscillation modes of undesired degrees are suppressed.

Figure 11A:
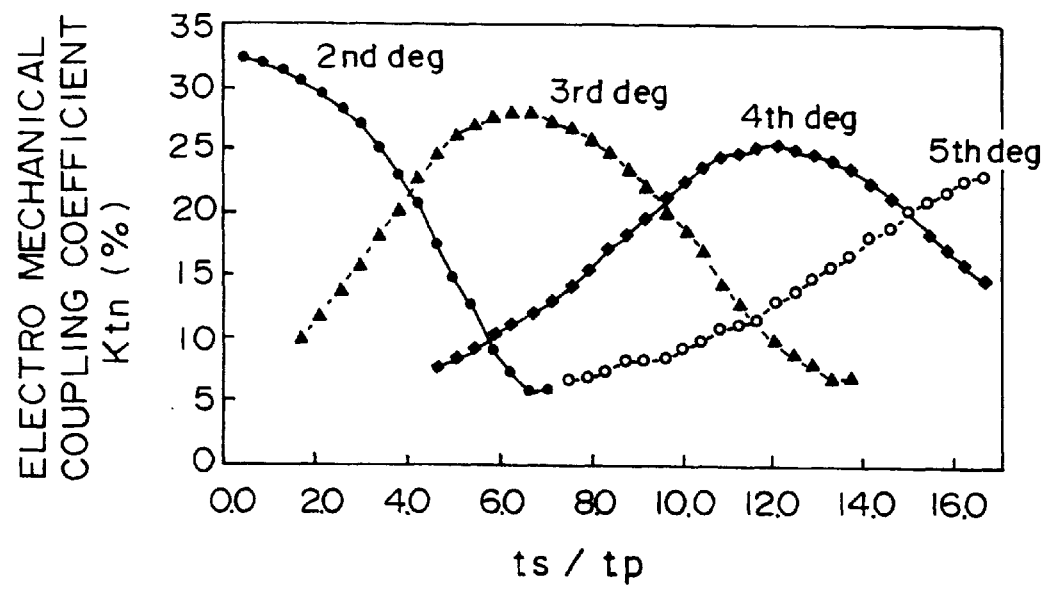
FIG. 11(a) illustrates the dependency of the electro-mechanical coupling coefficient Ktn(%) upon the film thickness ratio ts/tp in the thickness longitudinal oscillation mode of an n-th degree.
Figure 11B:
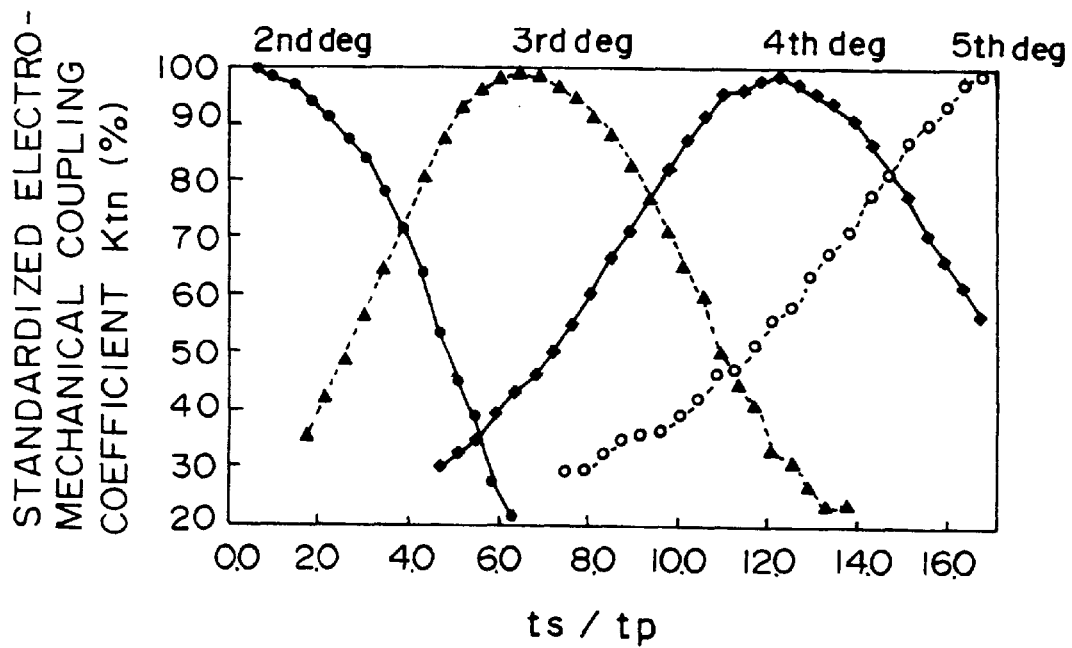
FIG. 11(b) illustrates the dependency of the standardized electro-mechanical coupling coefficient Ktn(%) upon the thickness ratio ts/tp in the thickness longitudinal oscillation mode of the n-th degree.

The present inventors have conducted the analysis in the same manner as in the above-mentioned embodiment 2 but using the diamond film (having a Young's modulus of 1210 GPa and a density of 3500 Kg/m³). FIG. 11(a) illustrates the dependency of the electro-mechanical coupling coefficient Ktn(%) of the thickness longitudinal oscillation mode of the n-th degree upon the film thickness ratio ts/tp. The standardized electro-mechanical coupling coefficient is found from the graph of FIG. 11(a), and a relationship between the standardized electro-mechanical coupling coefficients and the film thickness ratios ts/tp is shown in FIG. 11(b).

Figure 12:
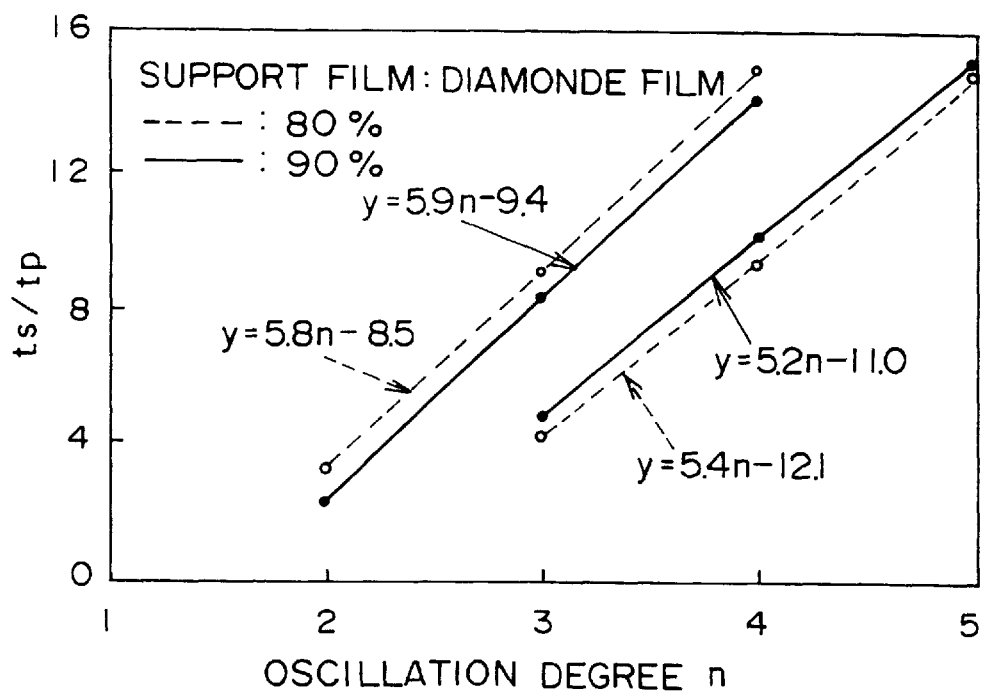
FIG. 12 is a graph of when a lower-limit value and an upper-limit value of a thickness ratio ts/tp are regarded as primary functions of the degree n of oscillation, the thickness ratio ts/tp being so selected that with which the lower-limit value and the upper-limit value thereof of the standardized electro-mechanical coupling coefficient of the piezoelectric resonator having piezoelectric ceramic films of PZT and a support film of the diamond film becomes 80% and 90%.

Further, the film thickness ratios ts/tp with which the standardized electro-mechanical coupling coefficients become not smaller than 80% and not smaller than 90% were found, and were plotted as a function of the degree n of oscillation as shown in FIG. 12.

From FIG. 12, when the thickness longitudinal oscillation mode of the n-th degree is utilized, the film thickness ratio ts/tp must satisfy;

$$5.4n-12.1 \leq ts/tp \leq 5.8n-8.5$$

(0<ts/tp when the degree n of oscillation is 2) so that the standardized electro-mechanical coupling coefficient becomes not smaller than 80%, and must satisfy;

$$5.2n-11.0 \leq ts/tp \leq 5.9n-9.4$$

so that the standardized electro-mechanical coupling coefficient becomes not smaller than 90%. That is, to obtain the standardized electro-mechanical coupling coefficient which is not smaller than 80% there hold 0<ts/tp≦3.1 in the case of the oscillation mode of the second degree, 4.1≦ts/tp≦8.9 in the case of the oscillation mode of the third degree, and 9.5≦ts/tp≦14.7 in the case of the oscillation mode of the fourth degree.

The piezoelectric resonator was further analyzed by changing, as a parameter, the ratio t1/t2 of the thickness t1 of the upper piezoelectric ceramic film 25 and the thickness t2 of the lower piezoelectric ceramic film 28. In this analysis, the thickness ts of the support film 23 and (t1+t2) were maintained constant, so that the third-degree mode was optimized. The results were as shown in FIG. 13.

Figure 13:
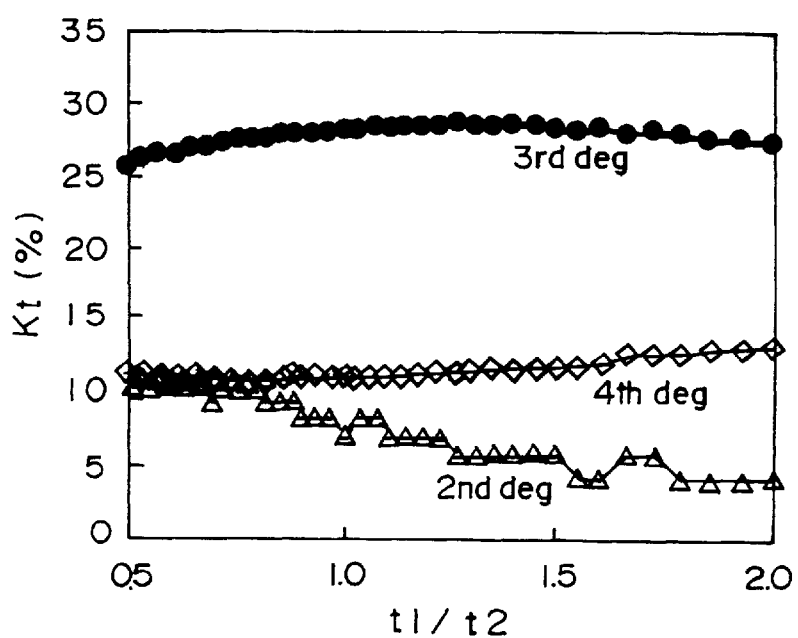
FIG. 13 is a graph illustrating electro-mechanical coupling coefficients in the second degree, third degree and fourth degree modes of when the thickness of the two piezoelectric ceramic films is varied.

From FIG. 13, it will be understood that the electro-mechanical coupling coefficient is maintained at a large value in the mode of the third degree even when the film thickness ratio t1/t2 of the piezoelectric ceramic films is changed, and the electro-mechanical coupling coefficients are maintained at small values in the mode of the second degree and in the mode of the fourth degree. That is, it will be understood that the electro-mechanical coupling coefficient is not adversely affected even when the thickness ratio of the piezoelectric ceramic films is deviated from 1. The piezoelectric resonator having the support film of silicon nitride was also analyzed to observe the same tendency.

(Embodiment 4)

In the piezoelectric resonator of the present invention having oscillation space shown in FIGS. 1 to 3, the piezoelectric ceramic films are used in two layers, the piezoelectric ceramic films are composed of a piezoelectric material containing Pb and Ti, the support film exhibits sound velocity (km/s) denoted by v, the sum of the thicknesses (μm) of the two piezo-electric ceramic films is denoted by tp, and the thickness (μm) of the support film is denoted by ts. In this case, it is desired that at the oscillation mode of the second degree, the ratio ts/tp satisfies, $$0<ts/tp<0.2v-0.76$$

at the oscillation mode of the third degree, the ratio ts/tp satisfies, $$0.25v-1.08 \leq ts/tp \leq 0.54v-1.84$$

and at the oscillation mode of the fourth mode, the ratio ts/tp satisfies 0.54v−1.75≦ts/tp≦0.87v−2.86 in the oscillation mode of the fourth degree.

When the piezoelectric resonator has two piezoelectric ceramic films, the above-mentioned relations are satisfied to optimize the ratio ts/tp of the thickness of the support film to the sum of thicknesses of the piezoelectric ceramic films in the oscillation mode of any degree n relying on the sound velocity V of the support film, the electro-mechanical coupling coefficient is maximized in the oscillation mode of any degree, and the electro-mechanical coupling coefficients in the oscillation modes of undesired degrees are suppressed.

The present inventors have analyzed the impedance of the piezoelectric resonator having the structure that is schematically illustrated in FIG. 7 based on the finite element method using a computer simulation.

Figure 14A:
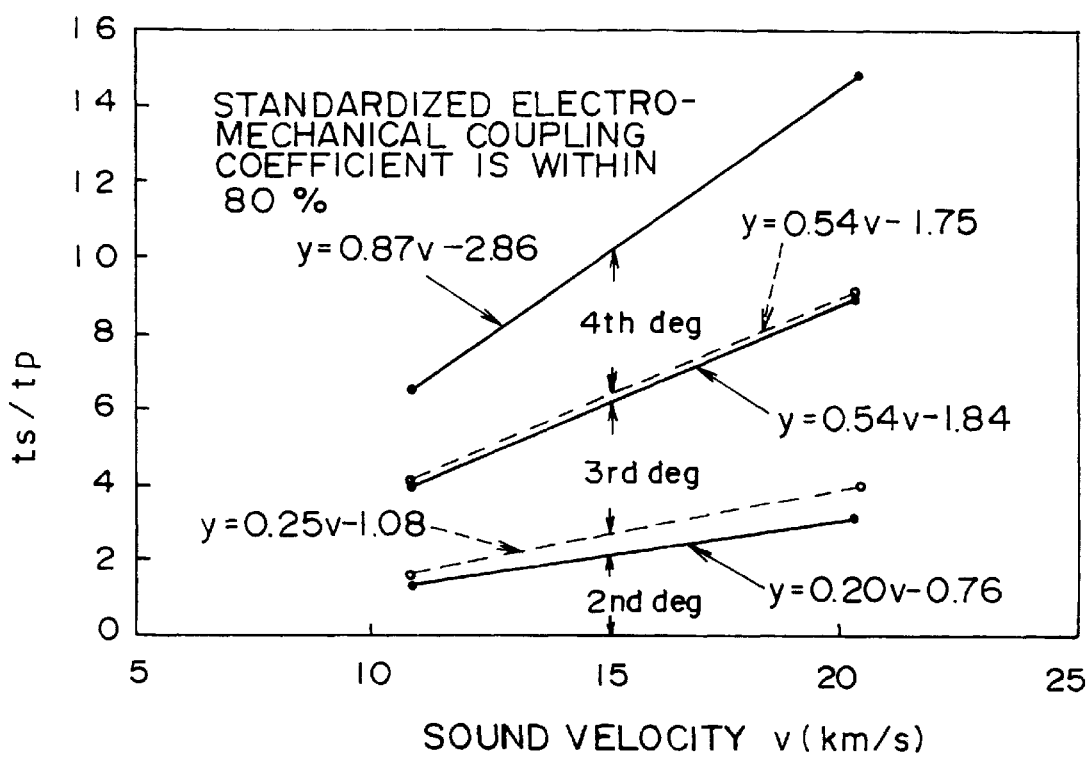
FIG. 14(a) is a graph of when the lower-limit value and the upper-limit value of the film thickness ratio with which the standardized electro-mechanical coupling coefficient becomes 80% are regarded as primary functions of the speed v of sound of the support film.
Figure 14B:
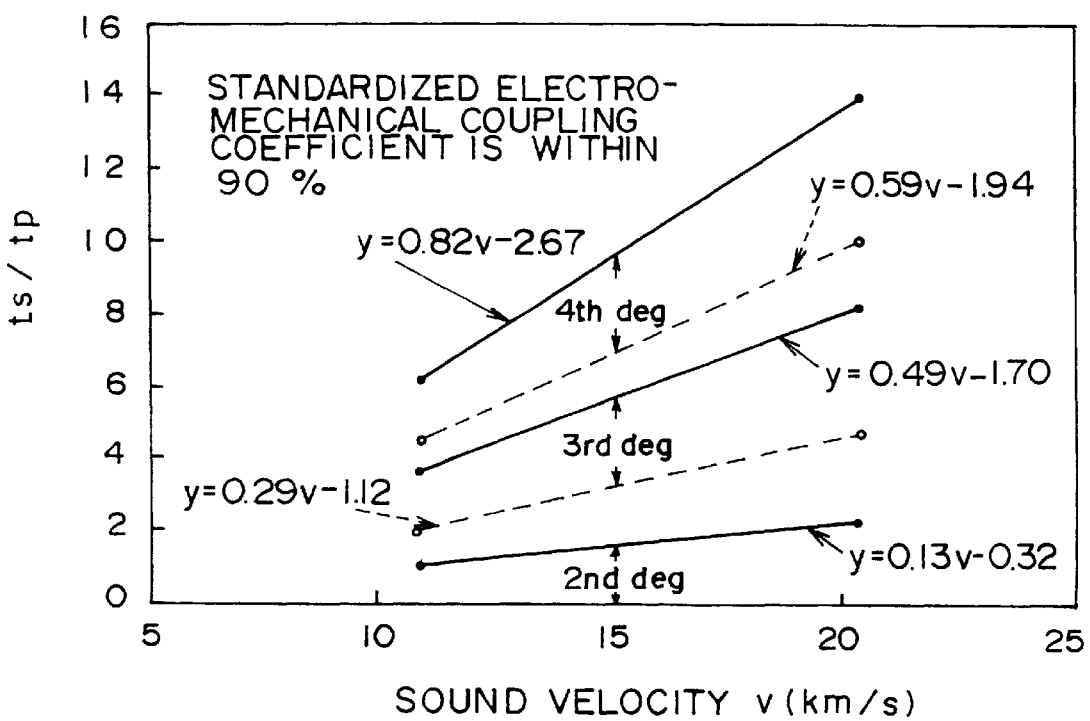
FIG. 14(b) is a graph of when the lower-limit value and the upper-limit value of the film thickness ratio with which the standardized electro-mechanical coupling coefficient becomes 90% are regarded as primary functions of the speed v of sound of the support film.

The conditions of analysis consisted of using piezoelectric ceramic films of PZT, selecting the thicknesses t1 and t2 of the piezoelectric ceramic films to be 0.6 μm,respectively, i.e., setting the sum tp of thicknesses of the piezoelectric ceramic films to be 1.2 μm, selecting the thickness of the electrode films to be 0.2 μm, using the support film exhibiting a sound velocity V (km/s), changing the film thickness ts (μm) as a parameter, finding the electro-mechanical coupling coefficients in the second-degree, third-degree and fourth-degree oscillation modes, calculating the standardized electro-mechanical coupling coefficients in the same manner as in the above-mentioned embodiment, plotting, in FIG. 14(a), the lower-limit values and upper-limit values of the film thickness ratios with which the standardized electro-mechanical coupling coefficients become not smaller than 80% as primary functions of the sound velocity V of the support film, and plotting the lower-limit values and upper-limit values for obtaining the coefficients of not smaller than 90% as primary functions in FIG. 14(b). The upper limit values are represented by solid lines and the lower-limit values are represented by broken lines.

As the support film, use was made of a silicon nitride film and a diamond film. The sound velocity V of the support film was found in compliance with $v=((\lambda+2\mu)/\rho)^{1/2}$ (where λ and ρ are Lame's constants, and μ is a density).

From FIG. 14(a), it will be understood that in the second-degree, third-degree and fourth-degree oscillation modes, the film thickness ratio ts/tp must satisfy 0<ts/tp≦0.2v−0.76 in the oscillation mode of the second degree, must satisfy 0.25v−1.08≦ts/tp≦0.54v−1.84 in the oscillation mode of the third degree, and must satisfy 0.54v−1.75≦ts/tp≦0.87v−2.86 in the oscillation mode of the fourth degree so that the standardized electro-mechanical coupling coefficient becomes not smaller than 80%.

From FIG. 14(b), further, it will be understood that the film thickness ratio ts/tp must satisfy 0<ts/tp≦0.13v−0.32 in the oscillation mode of the second degree, must satisfy 0.29v−1.12≦ts/tp≦0.49v−1.70 in the oscillation mode of the third degree, and must satisfy 0.59v−1.94≦ts/tp≦0.82v−2.67 in the oscillation mode of the fourth degree so that the standardized electro-mechanical coupling coefficient becomes not smaller than 90%.

(Embodiment 5)

Figure 15:
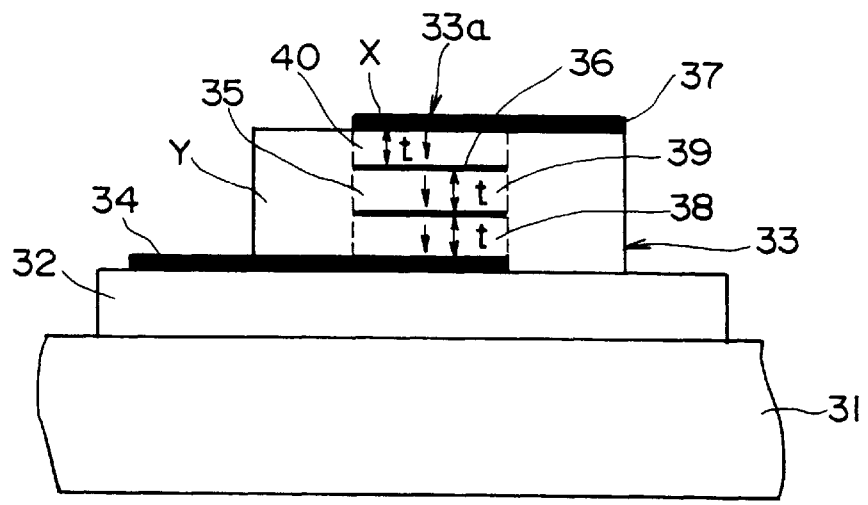
FIG. 15 is a sectional view illustrating a piezoelectric resonator having three piezoelectric ceramic films of the present invention.
Figure 16:
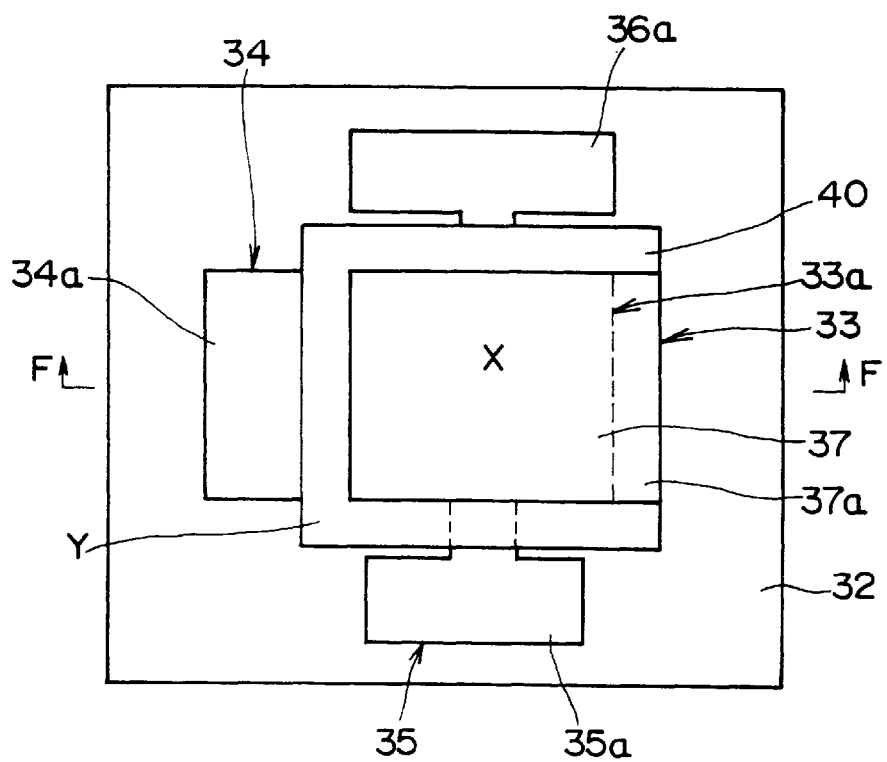
FIG. 16 is a plan view of the piezoelectric resonator of FIG. 15.

FIGS. 15 and 16 illustrate another example of the piezoelectric resonator of the present invention, wherein FIG. 15 is a sectional view, FIG. 16 is a plan view, and FIG. 15 is a sectional view along the line F—F in FIG. 16.

As shown in FIG. 15, the piezoelectric resonator of this type has a support film 32 formed on a substrate 31. A laminate 33 is provided on the upper surface of the support film 32. The laminate 33 is constituted by electrode films 34, 35, 36, 37 and piezoelectric ceramic films 38, 39 and 40. The electrode films 34, 35, 36, 37 and piezoelectric ceramic films 38, 39 and 40 are alternately laminated one upon the other to constitute a resonator element 33a. An uppermost electrode film 37 is formed on the central portion on the upper surface of the uppermost piezoelectric ceramic film 40, and a lowermost electrode film 34 is formed on the central portion on the lower surface of the lowermost piezoelectric ceramic film 38.

The piezoelectric ceramic films 38, 39 and 40 are polarized in the same direction in the direction of thickness. It is desired that the piezoelectric ceramic films 38, 39 and 40 have the same thickness t. When the dispersion in the thickness is not larger than 0.1%, however, the thicknesses may be regarded to be the same. It is further desired that the electrodes 34, 35, 36 and 37 have the same thickness. There will be no problem when the dispersion in the thickness is within 0.1%.

Referring to FIG. 16, the electrode films 34, 35, 36 and 37 are drawn at their ends toward the outside of the resonator element 33a. The drawn portions 34a, 35a, 36a and 37a thereof are so arranged as will not be overlapped one upon the other.

That is, the uppermost electrode film 37 and the lowermost electrode film 34 are connected to a pair of drawn electrode films 34a and 37a provided at opposing positions, and the electrodes 35 and 36 between the uppermost electrode layer 37 and the lowermost electrode layer 34 are connected to the pair of drawn portions 35a and 36a provided at opposing positions.

The electrode films 34, 35, 36 and 37 are superposed at a central portion X (resonator element 33a) of the laminate 33 to confine energy in the central portion X. The outer peripheries Y of the uppermost electrode film 37 have not been polarized, i.e., the piezoelectric ceramic films 38, 39 and 40 of the laminate 33, except the resonator element 33a, have not been polarized. In other words, the outer peripheries Y are so formed as to surround the central portion X, and are polarized in a random fashion.

In the thus constituted piezoelectric resonator, electric signals applied to the drawn portions 34a, 37a and 35a, 36a are so controlled that an electric field is established between the electrode 36 and the uppermost electrode layer 37 and between the electrode 35 and the lowermost electrode layer 34 having a phase opposite to, and having an intensity one-half (0.476 to 0.588 times) that of, the electric field established between the electrode 35 and the electrode 36.

Upon so controlling the electric signals, the amplitude of oscillation occurring in the piezoelectric ceramic film 39 between the uppermost piezoelectric ceramic film 40 and the lowermost piezoelectric ceramic film 38, is in opposite phase with, and is twice as intense as, the amplitude of oscillation occurring in the uppermost piezoelectric ceramic film 40 and in the lowermost piezoelectric ceramic film 38 at the upper and lower ends. Oscillation is canceled on the outer sides of the uppermost piezoelectric ceramic film 40 and of the lowermost piezoelectric ceramic film 38, i.e., oscillation is canceled in the uppermost electrode layer 37 and in the lowermost electrode layer 34. Thus, there is fabricated a piezoelectric resonator in which oscillation takes place only in the three piezoelectric ceramic layers 38, 39 and 40 but no oscillation takes place on the outer surfaces.

Oscillation takes place in opposite phases in the layers even when the piezoelectric ceramic films 38, 39 and 40 are polarized in the directions opposite to the polarized directions of the uppermost piezoelectric ceramic layer 40 and the lowermost piezoelectric ceramic layer 38, and even when an electric field of the same phase is applied; i.e. the same effect is obtained.

When the piezoelectric ceramic films are laminated in five or more layers, the amplitude of the oscillation taking place in the three or more piezoelectric ceramic films excluding the uppermost piezoelectric ceramic layer and the lowermost piezoelectric ceramic layer, two times as great as that taking place in the uppermost piezoelectric ceramic film and in the lowermost piezoelectric ceramic film.

Upon employing this constitution, the upper and lower neighboring piezoelectric ceramic films 38, 39 and 40 undergo the thickness longitudinal oscillation in opposite phases relative to each other, the oscillation in the portion excluding the uppermost piezoelectric ceramic film 36 and the lowermost piezoelectric ceramic film 38 being twice as intense as the amplitude of oscillation taking place in the uppermost piezoelectric ceramic film 36 and in the lowermost piezoelectric ceramic film 38. Therefore, oscillation is canceled in the uppermost electrode film 36 and in the lowermost electrode layer 38, and no oscillation occurs on the surfaces of the resonator element. Accordingly, oscillation of the resonator element 33a as a whole is confined inside thereof, requiring the provision of neither oscillation space A on the side opposite to the surf ace of the support film 32 on where the resonator element 33a is formed nor the formation of a mirror layer for attenuating the oscillation of the resonator element 33a.

Figure 17A:
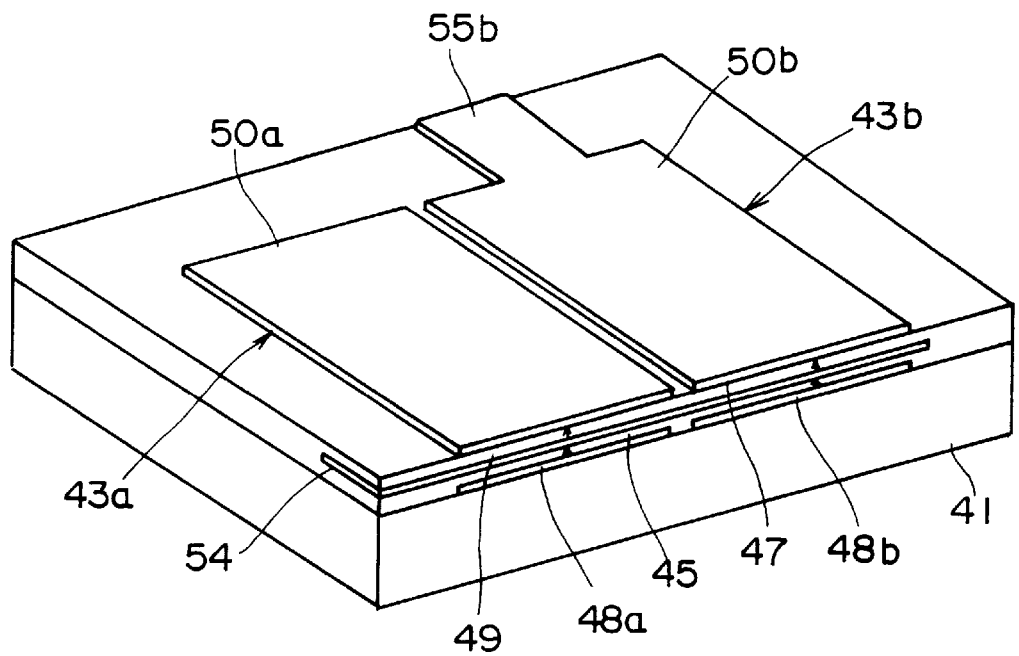
FIG. 17(a) is a perspective view illustrating, partly in cross section, a filter of the present invention.
Figure 17B:
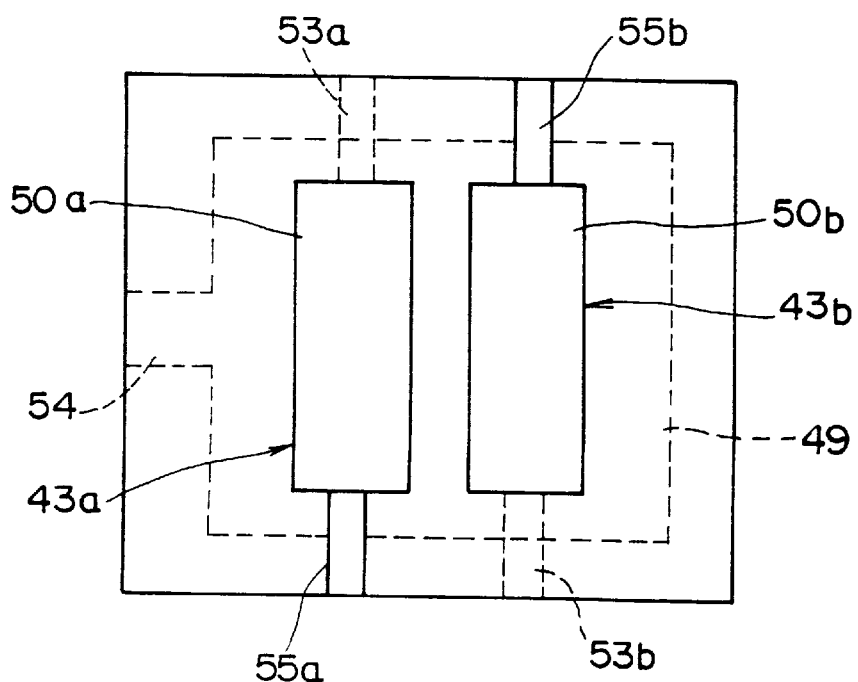
FIG. 17(b) is a plan view thereof.
Figure 18:
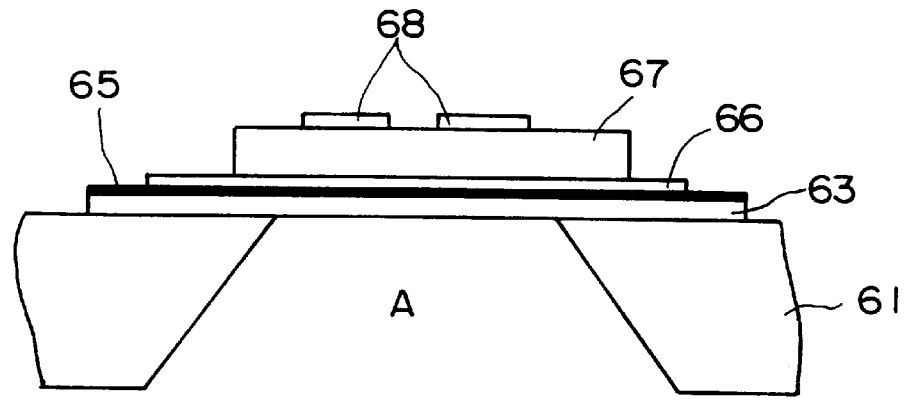
FIG. 18 is a sectional view illustrating the basic structure of a conventional piezoelectric resonator.
Figure 19:
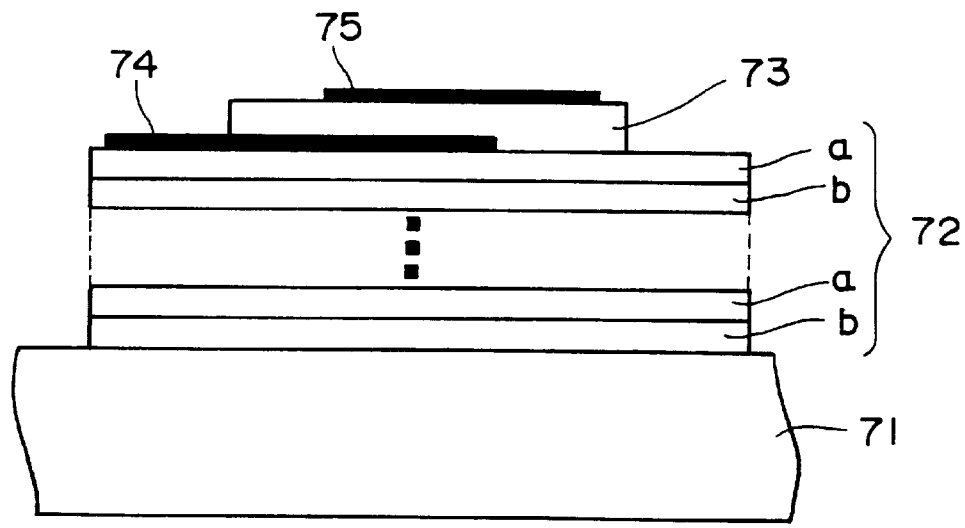
FIG. 19 is a sectional view illustrating another basic structure of a conventional piezoelectric resonator.

FIGS. 17(a) and 17(b) illustrate a filter of the present invention using the above-mentioned piezoelectric resonators. This filter has two resonator elements. That is, as shown in FIG. 17(b), the filter has two resonator elements 43a, 43b arranged in parallel maintaining a predetermined gap on a support film 41. The resonator element 43a is constituted by alternately laminating piezoelectric ceramic films 45, 47 and electrodes 48a, 49, 50a one upon the other, and the resonator element 43b is constituted by alternately laminating piezoelectric ceramic films 45, 47 and electrodes 48b, 49, 50b one upon the other. The piezoelectric films 45 and 47 of the two resonator elements 43a and 43b arranged in parallel, are extending and are connected. The piezoelectric ceramic films 45 and 47 are polarized in the same direction, and the resonator elements 43a and 43b operate in the thickness longitudinal oscillation mode.

The electrodes 48, 49 and 50 have drawn portions 53, 54 and 55. That is, electrode take-out portions 53a and 53b of the electrodes 48a and 48b are exposed on the side surfaces opposed to each other, an electrode take-out portion 54 of the electrode 49 is exposed on the side surface different from the side surface on where the end surfaces of the electrode take-out portions 53a and 53b are exposed, and electrode take-out portions 55a and 55b of the electrodes 50a and 50b are exposed on the side surfaces opposed to each other. Here, the electrode take-out portions 53a, 53b, 54, 55a and 55b are in no way limited thereto only.

In this filter, voltages of different polarities are applied to the electrode take-out portions 53a, 55a and to the electrode take-out portion 54, and an output voltage is taken out from the electrode take-out portions 53b and 55b.

This filter is fabricated by, for example, forming the electrodes 48 and 48b in parallel on the substrate 41, forming the piezoelectric ceramic film 45 so as to cover the electrodes 48a and 48b, forming an electrode 49 (ground electrode) on the surface of the piezoelectric ceramic film 15, forming the electrode film 47 on the electrode 49, and forming the electrodes 50a and 50b on the piezoelectric ceramic film 47.

The electrodes 48, 49 and 50 are arranged on a plane of a bulk thickness longitudinal filter to design the pass band by utilizing an even mode or an odd mode, or to design a structure similar to the one for erasing ripples or for motion. Here, the shapes of the electrodes 48, 49 and 50 are fabricated by adjusting the resonance frequency in a chief even mode or odd mode, or by various design methods for keeping way or erasing the generated ripples.

In the thus constituted filter, the piezoelectric ceramic films 45 and 47 are polarized in the same direction, and voltages of different polarities are applied to, for example, drawn portions 53a, 55a and to the drawn portion 54, so that oscillation takes place in opposite phases in the piezoelectric ceramic film 45 and in the piezoelectric ceramic film 47.

In this filter, oscillation of the fundamental mode is suppressed in the resonator element, and oscillation of a high-degree mode of not lower than the second degree are strongly excited. According to the present invention, the resonance elements are arranged in a plural number, making it possible to obtain a filter that works at frequencies higher than, and over a band wider than, the filters using the conventional piezoelectric resonators. Upon controlling the film thickness ratio ts/tp of the thickness of the support film to the sum of thicknesses of the piezoelectric ceramic films, further, there is obtained a favorable filter that suppresses electro-mechanical coupling coefficients of undesired oscillations in the modes of degrees lower than or higher than the degree of oscillation that is used.

(Embodiment 6)

Figure 20A:
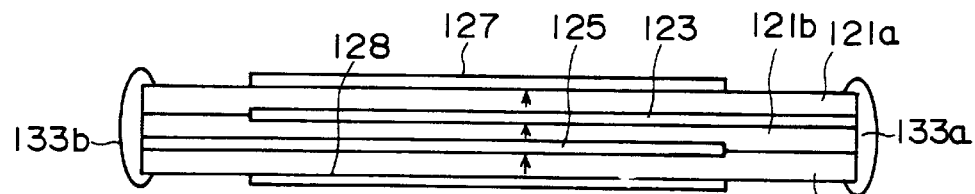
FIG. 20(a) is a sectional view and FIG. 20(b) is a plan view.
Figure 20B:
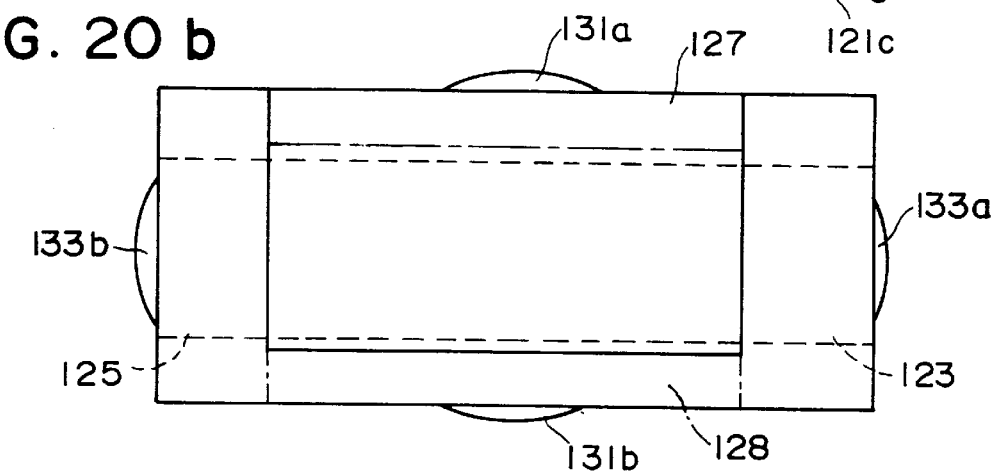

FIGS. 20a and 20b illustrate a laminate structure of a resonator element that is directly provided on the substrate without interposing a support film. FIG. 20a is a sectional view, and FIG. 20b is a plan view. These drawings do not illustrate the substrate for supporting the resonator element.

The resonator element has three piezoelectric ceramic layers (hereinafter simply referred to as piezoelectric members) 121a, 121b and 121c having the same thickness. An electrode 123 is interposed between the piezoelectric member 121a and the piezoelectric member 121b, and an electrode 125 is interposed between the piezoelectric member 121b and the piezoelectric member 121c.

An uppermost electrode layer 127 and a lowermost electrode layer 128 are formed on the upper and lower outermost surfaces of these laminated members.

The piezoelectric members 121a, 121b and 121c have the same thickness. The thickness can be regarded to be the same provided the dispersion in the thickness is not larger than 0.1%.

It is desired that the electrodes 123, 125, 127 and 128 have the same thickness. There occurs no problem provided the dispersion in the thickness is not larger than 0.1%. The electrodes 123 and 125 are formed in the form of layers by, as required, utilizing the effect of confining energy, so that desired characteristics are obtained.

The uppermost electrode 127 and the lowermost electrode 128 are connected to a pair of first terminal electrodes 131a and 131b provided at opposing positions, and the electrodes 123 and 125 between the uppermost electrode layer 127 and the lowermost electrode layer 128 are connected to a pair of second terminal electrodes 133a and 133b provided at opposing positions.

In the thus constituted resonator element, electric signals applied to the first terminal electrodes 131a, 131b and to the second terminal electrodes 133a, 133b are so controlled that an electric field is established between the electrode 123 and the uppermost electrode layer 127 and between the electrode 125 and the lowermost electrode layer 128, having a phase opposite to, and having an intensity one-half (0.476 to 0.588 times) that of the electric field established between the electrode 123 and the electrode 125.

Upon controlling the electric signals as described above, the amplitude of oscillation occurring in the piezoelectric member 121b between the uppermost piezoelectric member 121a and the lowermost piezoelectric member 121c, possesses a phase opposite to, and is two times as great as that of, the oscillation occurring in the uppermost piezoelectric member 121a and in the lowermost piezoelectric member 121c. Oscillation is canceled on the outer sides of the uppermost piezoelectric member 121a and of the lowermost piezoelectric member 121c, i.e., oscillation is canceled in the uppermost electrode layer 127 and in the lowermost electrode layer 128. Oscillation occurs only inside the three piezoelectric members 121a, 121b and 121c, and no oscillation occurs on the outer surfaces of the resonator element.

Oscillation assume opposite phases in the layers even when the piezoelectric member 121b is polarized in a direction opposite to the polarization direction of the uppermost piezoelectric member 121a and of the lowermost piezoelectric member 121c, and even when an electric field of the same direction is applied; i.e. the same effect is obtained.

When the piezoelectric members are laminated in five or more layers, the amplitude of the oscillation occuring in the three or more piezoelectric layers excluding the uppermost piezoelectric member and the lowermost piezoelectric member, may be two times as great as that taking place in the uppermost piezoelectric member and in the lowermost piezoelectric member.

Figure 21:
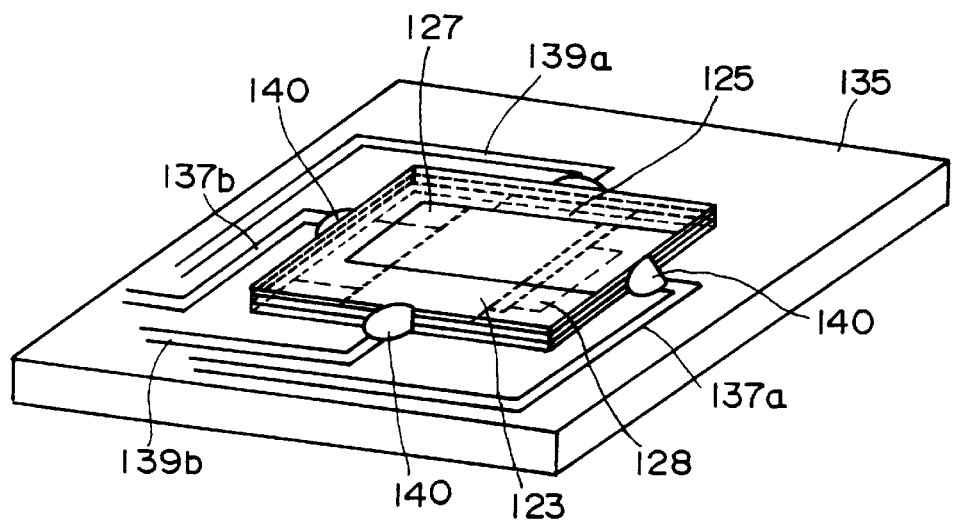
FIG. 21 is a sectional view illustrating a piezoelectric resonator in which the resonator element of FIG. 20 is mounted on the surface of the board.

FIG. 21 is a view illustrating the structure of the piezoelectric resonator in which the above-mentioned resonator element is directly mounted on the surface of the circuit board. In this piezoelectric resonator, the resonance element shown in FIG. 20 is in the form of a chip and is mounted on the surface of a substrate 135.

Circuit patterns 137a, 137b, 139a and 139b are formed on the surface of the substrate 135, and first terminal electrodes and second terminal electrodes are connected to these circuit patterns by soldering 140.

Figure 22:
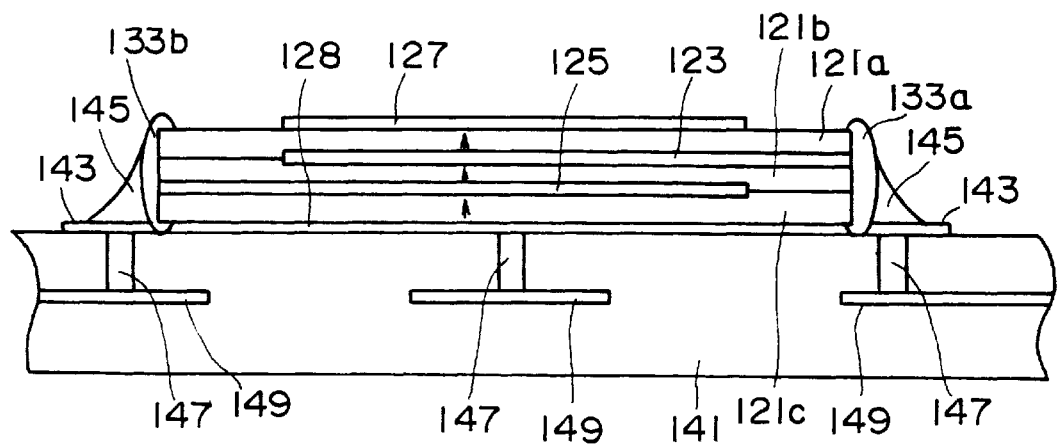
FIG. 22 is a sectional view illustrating the piezoelectric resonator in which the resonator element of FIG. 20 is mounted on a multi-layer circuit board.

In this piezoelectric resonator, the substrate may be a multi-layer substrate 141 as shown in FIG. 22. That is, surface electrodes 143 are formed at four places on the surface of the multi-layer substrate 141. To these surface electrodes 143 are connected the second terminal electrodes 133a, 133b and first terminals (not shown) by soldering 145.

The surface electrodes 143 are connected, through via-hole conductors 147, to the inner wirings 149 in the multi-layer substrate 141. Via-hole conductors 147 are further connected to the surface electrodes 143 connected to the first terminal electrodes, and are, hence, connected to the inner wirings 149 in the multi-layer substrate 141.

In this case, an embedded capacitor formed by utilizing the surface layer of the multi-layer substrate 141 or by utilizing a dielectric layer close thereto, is electrically connected in parallel with this piezoelectric resonator, thereby to form a piezoelectric resonator of the capacitor-embedded type.

Figure 23:
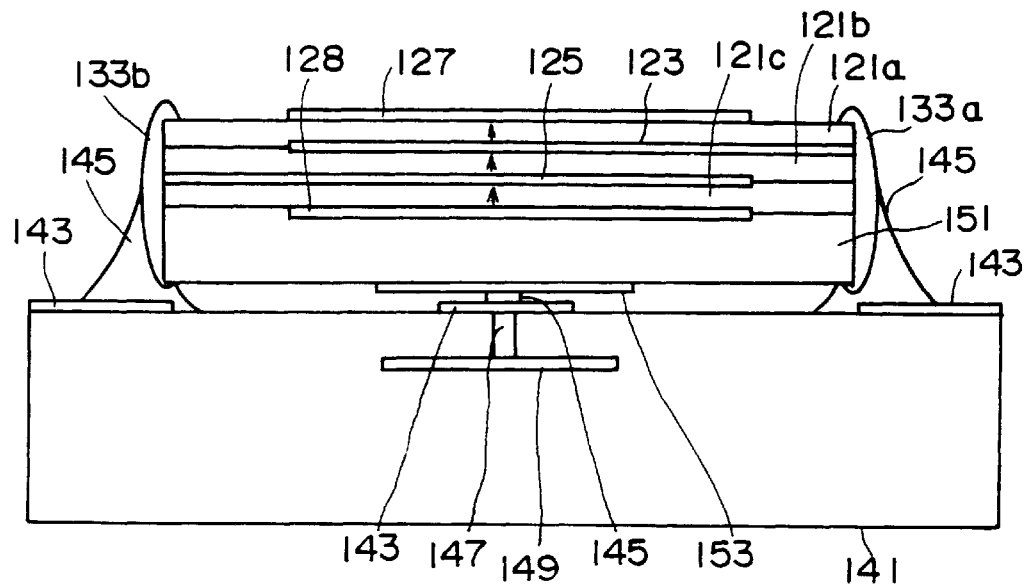
FIG. 23 is a sectional view illustrating a state where the piezoelectric resonator comprising the resonator element of FIG. 20 and a capacitor joined together, is mounted on the multi-layer circuit board.

FIG. 23 illustrates a piezoelectric resonator of the capacitor-embedded type by using a capacitor as the substrate, and in which the resonator element and the capacitor are formed integrally together. In this piezoelectric resonator, an electrode 153 is formed on the lower surface of the resonator element shown in FIG. 20 via a dielectric layer 157, and the resonator element and the capacitor are formed integrally together.

Like in the piezoelectric resonator shown in FIG. 22, second terminal electrodes 133a, 133b and first terminal electrodes (not shown) are joined by soldering 145 to surface electrodes 143 formed on the surface of the maltilayer substrate 141. Further, an electrode 153 of the capacitor is joined to the surface electrode 143 by soldering 145.

The electrode on the upper side of the capacitor is used in common with a lowermost electrode layer 128 of the resonator element. An electrostatic capacity is formed by the lowermost electrode layer 128 and an opposing electrode 153 formed via a dielectric layer 151.

The surface electrodes 143 to which the first terminal electrodes and the second terminal electrodes 133a, 133b are connected, are drawn on the surface of the multi-layer substrate 141, and the surface electrode 143 to which the electrode 153 of the capacitor is connected, is connected to an inner wiring 149 in the multi-layer substrate 141 through the via-hole conductor 147. The surface electrode 143 to which is connected the electrode 153 of the capacitor may be drawn to constitute the circuit.

In the thus constituted piezoelectric resonators shown in FIGS. 21, 22 and 23 as described above, the electric signals applied to the first terminal electrodes 131a, 131b and to the second terminal electrodes 133a, 133b are so controlled that an electric field is established between the electrode 123 and the uppermost electrode layer 127 and between the electrode 125 and the lowermost electrode layer 128, having a phase opposite to, and having an intensity one-half (0.476 to 0.588 times) that of, the electric field established between the electrode 123 and the electrode 125. No oscillation occurs on the outer surfaces of the resonator element. Therefore, characteristics of the piezoelectric resonator are not affected despite the resonator element is being intimately adhered to the substrate 135 without gap, or despite the resonator element is intimately adhered to the multi-layer substrate 141 or to the dielectric layer 151 of the capacitor without gap.

Further, upon intimately adhering the piezoelectric resonator without forming oscillation permission space as described above, the piezoelectric resonator as a whole is supported by the substrate 135, multi-layer substrate 141 or dielectric layer 151 of the capacitor. Despite the piezoelectric resonator is fabricated in a decreased thickness to cope with a high frequency, therefore, the structure withstands mechanical and thermal shocks. Besides, the piezoelectric resonator can be easily operated on the fundamental waves to cope with high frequencies.

As described earlier, furthermore, thin piezoelectric layers can be laminated relying on the sheet-forming technology or the thin-film technology, and the piezoelectric resonator can be fabricated to meet high frequencies of from 100 MHz to several GHz even by using fundamental waves.

As shown in FIG. 23, further, the piezoelectric resonator maintains its strength and reliability since it is formed integrally with the capacitor. Without being held in a package, therefore, the first terminal electrodes 131a, 131b and the second terminal electrodes can be directly mounted on the multi-layer substrate 141 via the solder 145 like a ceramic laminated-layer capacitor. In the piezoelectric resonator shown in FIG. 22, further, the capacitor may be embedded in the malti-layer substrate 141 and may be connected to the piezoelectric resonator through a via-hole conductor.

The piezoelectric resonator of the present invention can be laminated relying on the sheet-forming technology like a laminated-layer capacitor or a multi-layer IC package, and can be fabricated as a unitary structure upon co-firing. The piezoelectric resonator of the invention can also be obtained relying on the thin-film technology such as CVD, PVD or sputtering.

Figure 24:
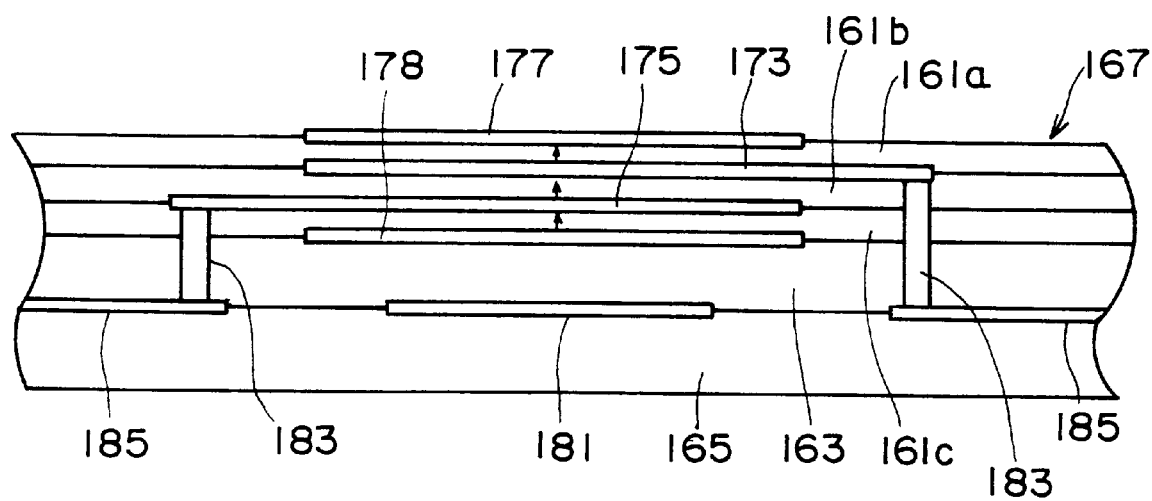
FIG. 24 is a sectional view illustrating the structure of the piezoelectric resonator in which the resonator element is embedded in the multi-layer substrate.

FIG. 24 illustrates a piezoelectric resonator device (circuit module) in which the piezoelectric resonator of the present invention is buried in a multi-layer substrate.

In this piezoelectric resonator device, a multi-layer substrate 167 is constituted by laminating piezoelectric members 161a, 161b, 161c that exhibit piezoelectric characteristic upon the polarization, as well as a dielectric layer 163 and an insulating layer 165. An electrode 173 is interposed between the piezoelectric member 161a and the piezoelectric member 161b, and an electrode 175 is interposed between the piezoelectric member 161b and the piezoelectric member 161c.

An outermost electrode layer 177 is formed on the outer surface of the piezoelectric member 161a, a lowermost electrode layer 178 that serves as the lowermost layer of the resonator element is formed between the piezoelectric member 161c and the dielectric layer 163, and the piezoelectric members 161a, 161b and 161c are polarized in the same direction in the direction of thickness.

The lowermost electrode 178 is used in common with the electrode on the upper side of the capacitor, and an electrode 181 is formed under the lowermost electrode 178 via the dielectric layer 163. That is, the electrode 181 is formed between the dielectric layer 163 and the insulating layer 165.

The electrode 173 and the electrode 175 are connected to the inner wiring 185 between the dielectric layer 163 and the insulating layer 165 through a pair of via-hole conductors 183 formed at opposing positions. The uppermost electrode layer 177 and the lowermost electrode layer 178 are connected to an internal wiring between the dielectric layer 163 and the insulating layer 165 through a pair of via-hole conductors formed at opposing positions though not shown. In this embodiment, the via-hole conductor 183 plays the same role as the terminal electrode.

Upon effecting the same control operation as described above, the thus constituted piezoelectric resonator device exhibits the same effect. Besides, the piezoelectric resonator device incorporates the piezoelectric resonator in the substrate. Thus, the module is constituted in a more compact size.

We claim:

1. A piezoelectric resonator having a resonator element in or on a substrate, said resonator clement comprising a laminate of a plurality of piezoelectric ceramic layers and a plurality of electrode layers which are alternatively laminated one upon the other, the piezoelectric ceramic layer neighboring upon and down being set to oscillate in opposite phases relative to each other, wherein said resonator element is formed on a support film formed on the surface of the substrate and wherein the surface of said support film opposite to the surface of the side on where the resonator element is formed, partly faces an oscillation space.

2. A piezoelectric resonator having a resonator element in or on a substrate, said resonator clement comprising a laminate of a plurality of piezoelectric ceramic layers and a plurality of electrode layers which are alternatively laminated one upon the other, the piezoelectric ceramic layer neighboring upon and down being set to oscillate in opposite phases relative to each other, wherein said resonator element is formed on a support film formed on the surface of the substrate and wherein an uppermost electrode layer is formed in the central portion on the upper surface of the piezoelectric ceramic layer located at the uppermost position, and the piezoelectric ceramic layers located on the outer side of said uppermost electrode layer are not polarized.

3. A piezoelectric resonator having a resonator element in or on a substrate, said resonator element comprising a laminate of a plurality of piezoelectric ceramic layers and a plurality of electrode layers which are alternatively laminated one upon the other, the piezoelectric ceramic layer neighboring upon and down being set to oscillate in opposite phases relative to each other, wherein said resonator element is formed on a support film formed on the surface of the substrate and having two piezoelectric ceramic layers.

4. The piezoelectric resonator according to claim 3, wherein said resonator element operates in a thickness longitudinal oscillation mode, and has an even number of piezoelectric ceramic layers.

5. The piezoelectric resonator according to claim 3 wherein said piezoelectric ceramic layer are polarized in the direction of thickness, the piezoelctric layer neighboring up and down being polarized in the opposite directions.

6. The piezoelectric resonator according to claim 3 wherein said piezoelectric ceramic layers are formed of piezoelectric ceramics containing Pb and Ti, said support film is formed of silicon nitride, and when the sum of thicknesses of said piezoelectric ceramic layers is denoted by tp, the thickness of said support film by ts and the degree of oscillation in the thickness longitudinal oscillation mode by n, the ratio ts/tp satisfies the following formula, $$2.4n-5.6 \leq ts/tp \leq 2.7n-4.0$$

(0<ts/tp when the degree n of oscillation is 2).

7. The piezoelectric resonator according to claim 3, wherein said piezoelectric ceramic layers are formed of piezoelectric ceramic containing Pb and Ti, said support film is formed of diamond, and when the sum of thicknesses of said piezoelectric ceramic layers is denoted by tp, the thickness of said support film by ts and the degree of oscillation in the thickness longitudinal oscillation mode by n, the ratio ts/tp satisfies the following formula, $$5.4n-12.1 \leq ts/tp \leq 5.8n-8.5$$

(0<ts/tp when the degree n of oscillation is 2).

8. The piezoelectric resonator according to claim 3, wherein said piezoelectric ceramic layers arc formed of piezoelectric ceramics containing Pb and Ti, and when the sound velocity (km/s) of said support film is denoted by, the sum of thicknesses of said piezoelectric ceramic layers by tp, and the thickness of said support film by ts, the ratio ts/tp satisfies the following formulas, $$0<ts/tp \leq 0.2v-0.76$$

in the oscillation mode of the second degree, $$0.25v-1.08 \leq ts/tp \leq 0.54v-1.84$$

in the oscillation mode of the third degree, and $$0.54v-1.75 \leq ts/tp \leq 0.87v-2.86$$

in the oscillation mode of the fourth degree.

9. A piezoelectric resonator having a resonator clement in or on a substrate, said resonator clement comprising a laminate of a plurality of piezoelectric ceramic layers and a plurality of electrode layers which are alternatively laminated one upon the other, the piezoelectric ceramic layer neighboring upon and down being set to oscillate in opposite phases relative to each other, wherein said resonator element is formed on a support film formed on the surface of the substrate and wherein:

the laminate constituting said resonator elements includes the piezoelectric ceramic layers of the same thickness in an odd number which is not smaller than three, and has electrode layers formed on the uppermost layer and on the lowermost layer; and the amplitude of oscillation occurring in the intermediate piezoelectric ceramic layers between the uppermost piezoelectric ceramic layers between the uppermost piezoelectric ceramic layer and the lowermost piezoelctric ceramic layer is two times as great as the amplitude of oscillation occurring in the uppermost piezoelectric ceramic layer and in the lowermost piezoelectric ceramic layer.

10. A piezoelectric resonator having a resonator element in or on a substrate, said resonator clement comp sing a laminate of a plurality of piezoelectric ceramic layers and a plurality of electrode layers which are alternatively laminated one upon the other, the piezoelectric ceramic layer neighboring upon and down being set to oscillate in opposite phases relative to each other wherein:

said resonator element is formed in the substrate or directly on the surface of the substrate;

the laminate constituting said resonator element includes the piezoelectric ceramic layers of the same thickness in an odd number which is not smaller than three, and has electrode layers formed on the outer surfaces of the uppermost piezoelectric ceramic layer and of the lowermost piezoelectric ceramic layer; and the amplitude of oscillation occurring in the intermediate piezoelectric ceramic layers between the uppermost piezoelectric ceramic layer and the lowermost piezoelectric ceramic layer is two times as great as the amplitude of oscillation occurring in the uppermost piezoelectric ceramic layer and in the lowermost piezoelectric ceramic layer.

11. The piezoelectric resonator according to claim 10, wherein:

said resonator element has a pair of first terminal electrodes and a pair of second terminal electrodes connected to some of the plurality of electrode layers;

between the pair of first terminal electrodes, one first terminal electrode is connected to the uppermost electrode layer, and the other first terminal electrode is connected to the lowermost electrode layer; and the pair of second terminal electrodes are alternately connected to a plurality of intermediate electrode layers positioned between the uppermost electrode layer and the lowermost electrode layer.

12. The piezoelectric resonator according to claim 10, which operates in the thickness longitudinal oscillation mode or in the thickness shear oscillation mode.

13. The piezoelectric resonator according to claim 10, wherein said substrate is a circuit board or a capacitor.

14. A filter having a plurality of resonance elements arranged in parallel in or on the surface of a substrate; wherein said resonator elements comprise a laminate of a plurality of piezoelectric ceramic layers and a plurality of electrode layers alternately laminated one upon the other in a manner that the piezoelectric ceramic layers neighboring up and down are set to oscillate in opposite phases relative to each other, and a pair of first terminal electrodes and a pair of second terminal electrodes connected to some of the plurality of electrode layers;

the laminate constituting said resonator elements includes the piezoelectric ceramic layers of the same thickness in an odd number which is not smaller than three, and has electrode layers disposed on the outer surface of the uppermost piezoelectric ceramic layer and on the outer surface of the lowermost piezoelectric ceramic layer;

between the pair of first terminal electrodes, one first terminal electrode is connected to the uppermost electrode layer, and the other first terminal electrode is connected to the lowermost electrode layer;

the pair of second terminal electrodes are alternately connected to a plurality of intermediate electrode layers positioned between the uppermost electrode layer and the lowermost electrode layer; and the amplitude of oscillation occurring in the intermediate piezoelectric ceramic layers between the uppermost piezoelectric ceramic layer and the lowermost piezoelectric ceramic layer is two times as great as the amplitude of oscillation occurring in the uppermost piezoelectric ceramic layer and in the lowermost piezoelectric ceramic layer.

* * * * *